US008587336B2

(12) United States Patent
Sueyoshi et al.

(10) Patent No.: US 8,587,336 B2
(45) Date of Patent: Nov. 19, 2013

(54) RECONFIGURABLE LOGIC BLOCK, PROGRAMMABLE LOGIC DEVICE PROVIDED WITH THE RECONFIGURABLE LOGIC BLOCK, AND METHOD OF FABRICATING THE RECONFIGURABLE LOGIC BLOCK

(75) Inventors: Toshinori Sueyoshi, Kumamoto (JP); Masahiro Iida, Kumamoto (JP); Motoki Amagasaki, Kumamoto (JP); Kazuhiko Taketa, Gifu (JP); Taketo Heishi, Osaka (JP); Nobuharu Suzuki, Tokyo (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 1324 days.

(21) Appl. No.: 11/598,679

(22) Filed: Nov. 14, 2006

(65) Prior Publication Data
US 2007/0186203 A1   Aug. 9, 2007

(30) Foreign Application Priority Data

Nov. 15, 2005   (JP) ................................. 2005-330268
Jun. 15, 2006   (JP) ................................. 2006-166387

(51) Int. Cl.
*H03K 19/173*   (2006.01)

(52) U.S. Cl.
USPC .................. 326/38; 326/37; 326/39; 326/42; 326/47; 716/116; 716/117; 716/121; 716/128; 716/135

(58) Field of Classification Search
USPC ............. 716/16–17, 116, 117, 121, 128, 132, 716/135; 712/220; 326/37–50
See application file for complete search history.

(56) References Cited

U.S. PATENT DOCUMENTS

| 5,526,276 | A   | * | 6/1996  | Cox et al. ........................ 716/17 |
| 5,805,477 | A   |   | 9/1998  | Perner |
| 6,130,553 | A   |   | 10/2000 | Nakaya |
| 6,812,737 | B2  |   | 11/2004 | Sueyoshi et al. |
| 6,943,580 | B2  |   | 9/2005  | Lewis et al. |
| 6,998,872 | B1  |   | 2/2006  | Chirania et al. |
| 7,030,652 | B1  |   | 4/2006  | Lewis et al. |
| 2003/0007636 | A1 | * | 1/2003 | Alves et al. ..................... 380/37 |
| 2003/0055852 | A1 | * | 3/2003 | Wojko .......................... 708/230 |
| 2005/0190597 | A1 | * | 9/2005 | Kato ........................ 365/185.08 |
| 2006/0091903 | A1 | * | 5/2006 | Sood .............................. 326/40 |
| 2006/0248317 | A1 | * | 11/2006 | Vorbach et al. ............... 712/221 |

FOREIGN PATENT DOCUMENTS

| EP | 0 690 579   | 1/1996 |
| JP | 8-51355     | 2/1996 |
| JP | 10-111790   | 4/1998 |
| JP | 11-24891    | 1/1999 |
| JP | 11-122096   | 4/1999 |
| JP | 2002-511173 | 4/2002 |
| JP | 2003-18000  | 1/2003 |
| JP | 3580785     | 7/2004 |
| WO | 99/00739    | 1/1999 |

OTHER PUBLICATIONS

Office Action mailed on Dec. 16, 2008 and issued in corresponding Japanese Patent Application No. 2006-166387.

* cited by examiner

*Primary Examiner* — Nha Nguyen

(57) ABSTRACT

A reconfigurable logic block has a first circuit that configures an arithmetic circuit and a second circuit that configures a circuit outside of the arithmetic circuit. A plurality of different circuits are configured by changing the settings of predetermined signals in the first and second circuits.

33 Claims, 25 Drawing Sheets

Fig. 4A
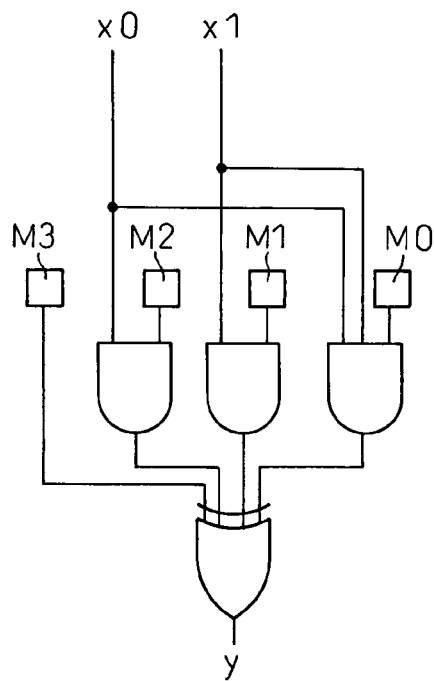
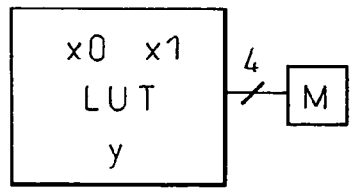
Fig. 4B
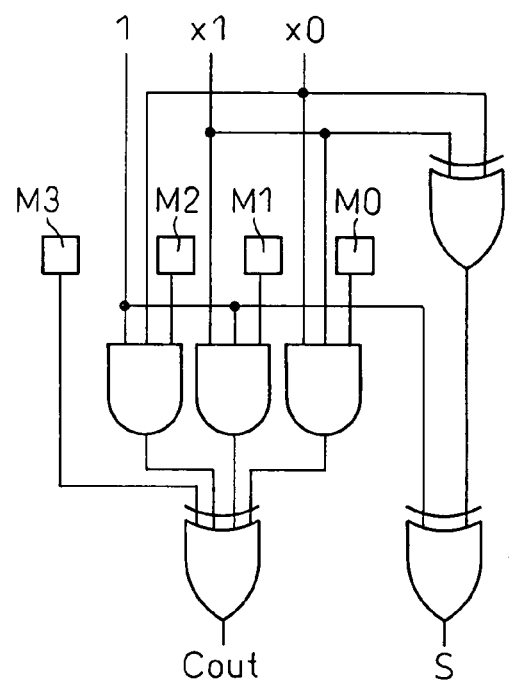
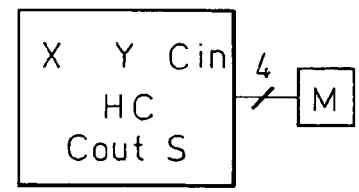

Fig.5A
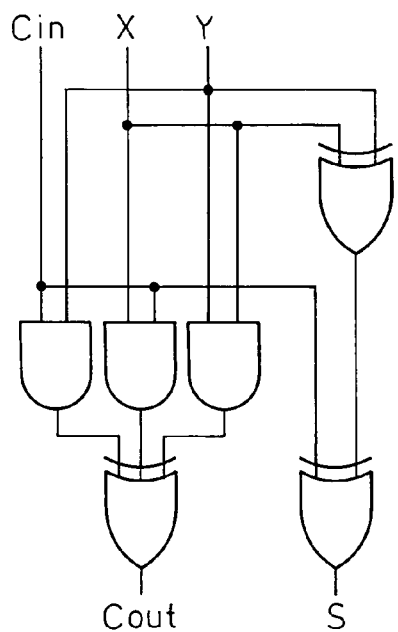
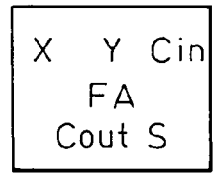
Fig.5B
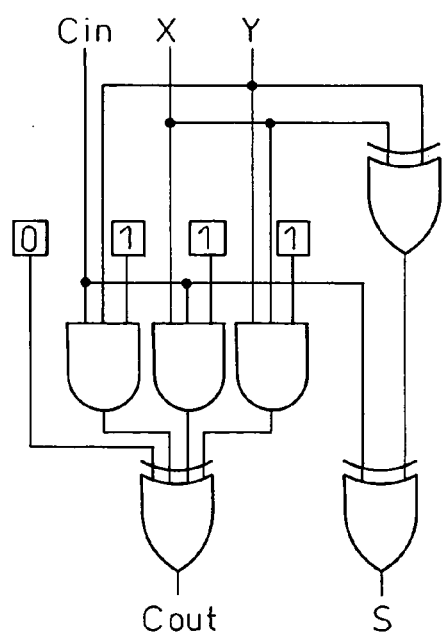
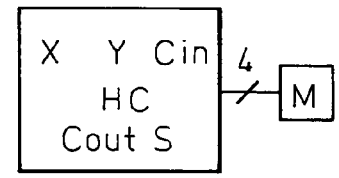

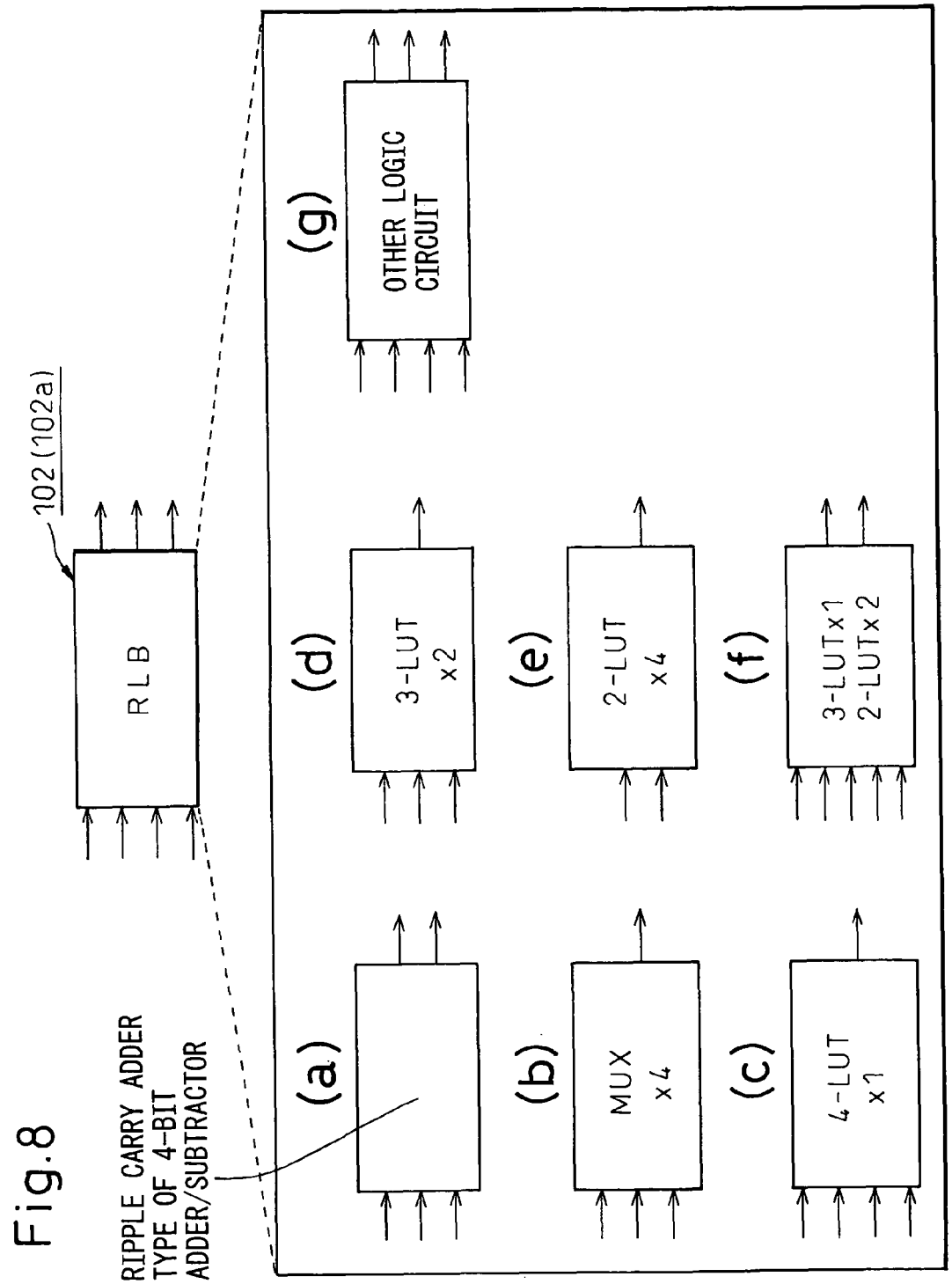

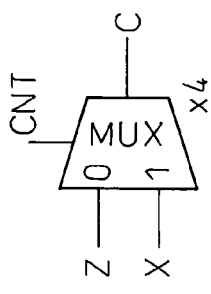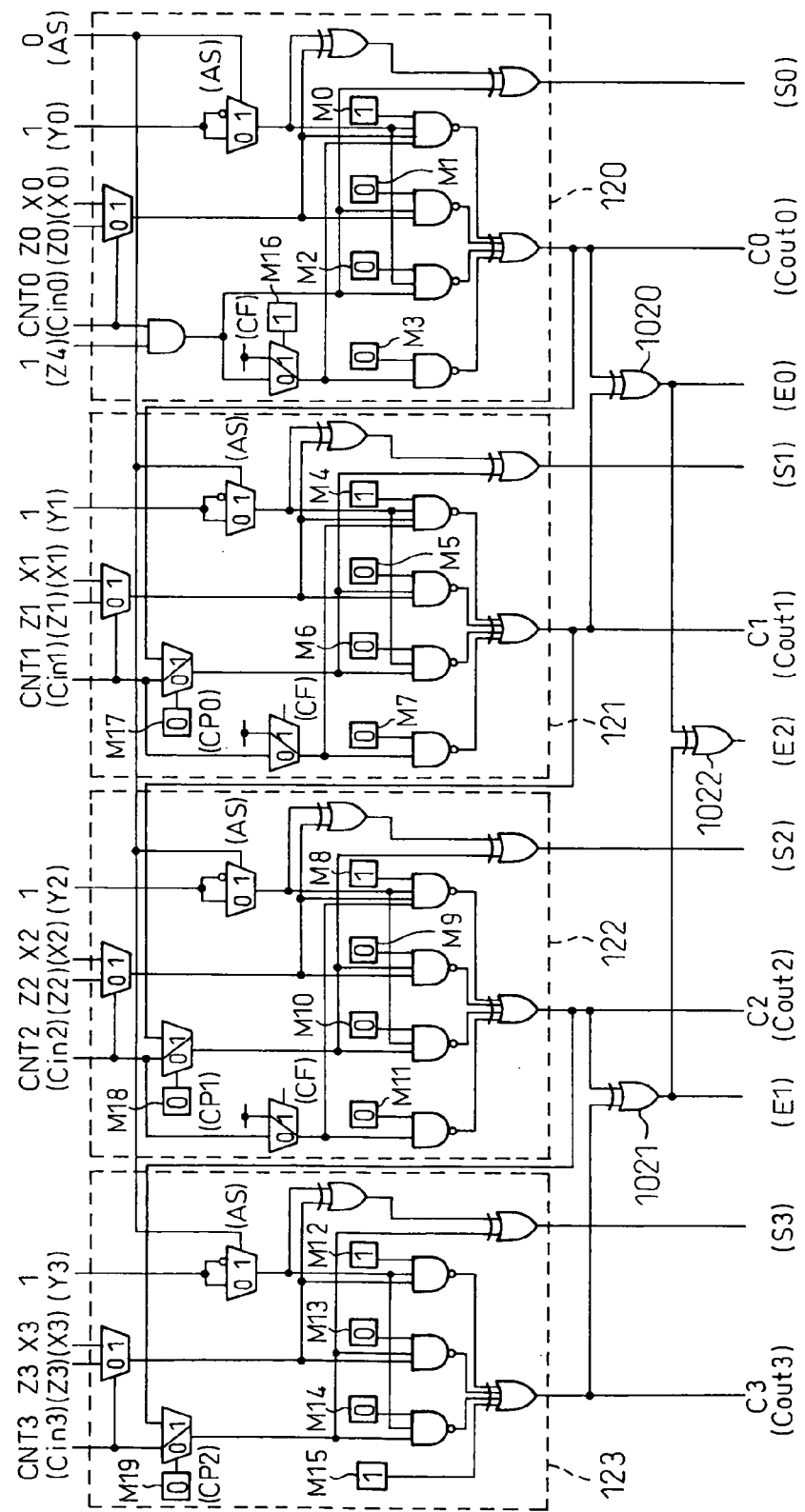
Fig.10A
Fig.10B

RECONFIGURABLE LOGIC BLOCK, PROGRAMMABLE LOGIC DEVICE PROVIDED WITH THE RECONFIGURABLE LOGIC BLOCK, AND METHOD OF FABRICATING THE RECONFIGURABLE LOGIC BLOCK

CROSS REFERENCE TO RELATED APPLICATION

This application is based upon and claims the benefit of priority from, the prior Japanese Patent Application Nos. 2005-330268 filed on Nov. 15, 2005 and 2006-166387 filed on Jun. 15, 2006, the entire contents of which are incorporated herein by reference.

BACKGROUND OF THE INVENTION

1. Field of the Invention

The present invention relates to a reconfigurable logic block (RLB), a programmable logic device that is provided with an RLB, and a method of fabricating an RLB, and, in particular, to a technique of fabricating an RLB that enables a reduction in implementation area.

2. Description of the Related Art

Programmable logic devices have recently attracted attention as devices that a user can use to implement logic circuits to suit various different requirements, by electrically programming the internal circuitry thereof. Programmable logic devices (PLDs), field programmable gate arrays (FPGAs), dynamically reconfigurable processors (DRPs), or digital application processor/distributed network architecture (DAP/DNA) devices are known as examples of such programmable logic devices. In addition to being used in the trial manufacture of hardware, they are also used in themselves for configuring large-scale circuits (such as microprocessors) having various different functions.

In order to improve the capabilities of programmable logic devices, new reconfigurable logic block (RLBs) have become necessary. In other words, the RLBs that configure prior-art programmable logic devices can be considered within two frameworks: fine-grained and coarse-grained type.

More specifically, an FPGA or the like can use an RLB as the basis of a look-up table (LUT) employing the fine-grain approach, or a DRP or DAP/DNA or the like can use an RLB as the basis of an arithmetic and logical unit (ALU).

In this case, the LUT is configured of memory, making it possible to implement any desired logic circuit, the number of bits N of input signals of logic circuits that can be implemented corresponds to the number of bits of memory addresses configuring the LUT, and a one-bit signal is output as an output therefrom. Thus a logic circuit that can be implemented in one LUT is an arbitrary N-input, 1-output logic circuit. Note that this kind of LUT is represented by an N-input LUT (N-LUT) in this document.

The fine-grain approach is superior for logical operations in bit units, with methods using LUTs in RLBs, and the coarse-grain approach is superior for arithmetic operations in byte units, with method using ALUs in RLBs.

In the prior art, Japanese Unexamined Patent Publication (Kohyo) No. 2002-511173 proposes an integrated circuit in which the effective area efficiency has been improved even with standard mutual connections, by mixing arithmetic and logic cells, as a method of providing reconfigurable calculation rules that enable flexibility of software development and the capability of solutions by dedicated hardware.

In addition, Japanese Unexamined Patent Publication (Kokai) No. 10-111790 of the prior art proposes a device wherein components such as an accumulator, multiplier and adder are efficiently implemented within one compact cell, as an operation cell configured of a multiplexer and a steering logic circuit for controlling the same. The steering logic circuit receives configuration signals in accordance with the application to control the multiplexer and select a path.

Furthermore, Japanese Unexamined Patent Publication (Kokai) Nos. 11-024891 and 11-122096 of the prior art propose a programmable function block provided with a full adder and front logic, as means of providing a programmable function block that is fast and is also multi-function.

Additionally, Japanese Unexamined Patent Publication (Kokai) No. 2003-018000 of the prior art proposes a method of fabricating an LUT that is provided with a plurality of LUT units and an internal configuration control means that controls the internal configuration created by that plurality of LUT units, in an FPGA.

As described above, since a prior-art device such as an FPGA based on a fine-grained LUT is inferior for implementing an arithmetic circuit, another component such as a multiplier is mounted separately, and thus the area efficiency (implementation efficiency) of the chip is reduced by that amount.

Similarly, a device such as a DRP or DAP/DNA based on a coarse-grained type ALU has a bad area efficiency when used to configure a random logic (glue logic) circuit. More specifically, any deterioration of capabilities is avoided by having an arithmetic-logic unit that is called a data management unit (DMU) in addition to the ALU, but if this arithmetic-logic unit is not used, that in itself will be a cause of a drop in area efficiency. This makes it impossible to prevent deterioration in the area efficiency of the chip.

More specifically, since an adder circuit of the operation cell disclosed in Japanese Unexamined Patent Publication (Kokai) No. 10-111790 is configured of an two 8-LUTs, by way of example, and the two LUTs are not connected internally, the original capability thereof as an adder is insufficient from the viewpoints of both area efficiency and speed. In addition, since each RLB of the operation cell disclosed in Japanese Unexamined Patent Publication (Kokai) No. 10-111790 is configured of two 8-LUTs during logical operations, the area efficiency thereof is even worse.

The programmable function block disclosed in Japanese Unexamined Patent Publication (Kokai) No. 11-024891 by way of example is provided with a one-bit full adder and front logic within each RLB, but since carries are through external wiring during operations with a plurality of bits, problems arise in that speed overheads increase and completion of the logic cannot be ensured during logical operations.

SUMMARY OF THE INVENTION

An object of the present invention is to maintain a high area efficiency of a chip, regardless of a circuitry configured therein, and aim for both a higher speed and a lower low power consumption.

According to the present invention, there is provided a reconfigurable logic block comprising a first circuit that configures an arithmetic circuit and a second circuit that configures a circuit outside of the arithmetic circuit, wherein a plurality of different circuits are configured by changing the settings of predetermined signals in the first and second circuits.

According to the present invention, there is also provided a programmable logic device comprising a plurality of reconfigurable logic blocks arrayed in a matrix, a plurality of wires connecting the reconfigurable logic blocks, a plurality of switch blocks provided at intersections between the wires, a plurality of connection blocks provided between input-output lines of each of the reconfigurable logic blocks and the wires, and I/O blocks that perform input and output with respect to the exterior, wherein each of the reconfigurable logic blocks comprises a first circuit that configures an arithmetic circuit and a second circuit that configures a circuit outside of the arithmetic circuit; and a plurality of different circuits are configured by changing the settings of predetermined signals in the first and second circuits.

The first circuit may comprise an adder circuit, and the second circuit may comprise a canonical form of logic circuit. The first circuit may be a full-adder circuit or a half-adder circuit. The second circuit may be a Reed-Muller canonical form of logic circuit. The first circuit may comprise a plurality of adder circuits, and wirings among the plurality of adder circuits may be formed within the reconfigurable logic block.

The setting of predetermined signals in the first and second circuits may be done by fixing the predetermined signals to a first power level or a second power level. The reconfigurable logic block may further comprise a memory or signal lines for setting predetermined signals in the first and second circuits.

The memory may be a volatile memory, and data may be written to the volatile memory during an initial setting in which a power voltage is supplied to the reconfigurable logic block. The memory may be a non-volatile memory, and write processing of data may be performed beforehand with respect to the non-volatile memory before the reconfigurable logic block is activated for use in practice.

The reconfigurable logic block may comprise a plurality of hybrid cells having differing circuit configurations. The reconfigurable logic block may comprise a plurality of hybrid cells having the same circuit configuration.

Further, according to the present invention, there is provided a method of creating a reconfigurable logic block comprising a first circuit that configures an arithmetic circuit and a second circuit that configures a circuit outside of the arithmetic circuit, wherein the reconfigurable logic block comprises a different circuit that causes changes in the settings of predetermined signals in the first and second circuits.

The setting of predetermined signals in the first and second circuits may be done by fixing the predetermined signals to a first power level or a second power level. The setting of predetermined signals in the first and second circuits may be done by data stored in a memory or data distributed to a signal line. The memory may be a volatile memory, and data may be written to the volatile memory in an initial setting in which power is supplied to the reconfigurable logic block. The memory may be a non-volatile memory, and write processing of data may be performed beforehand with respect to the non-volatile memory before the reconfigurable logic block is activated for use in practice.

In addition, according to the present invention, there is also provided a method of configuring an ASIC by utilizing a method of creating a reconfigurable logic block comprising a first circuit that configures an arithmetic circuit and a second circuit that configures a circuit outside of the arithmetic circuit, wherein the reconfigurable logic block comprises a different circuit that causes changes in the settings of predetermined signals in the first and second circuits; and the setting of predetermined signals in the first and second circuits is done by fixing the predetermined signals to a first power level or a second power level.

The first circuit may comprise an adder circuit, and the second circuit may comprise a canonical form of logic circuit.

The first circuit may comprise a full-adder circuit or a half-adder circuit. The second circuit may comprise a Reed-Muller canonical form of logic circuit. The first circuit may comprise a plurality of adder circuits, and wirings among the plurality of adder circuits may be formed within the reconfigurable logic block.

BRIEF DESCRIPTION OF THE DRAWINGS

The present invention will be more clearly understood from the description of the preferred embodiments as set forth below with reference to the accompanying drawings, wherein:

FIGS. 4A and 4B are illustrative of a model of the hybrid cell shown in FIG. 3 (1 of 2);

FIGS. 5A and 5B are also illustrative of a model of the hybrid cell shown in FIG. 3 (2 of 2);

FIG. 8 is a block diagram of circuit functions that can be implemented with the RLB of FIG. 7;

FIGS. 10A and 10B show another example of a circuit configured of the RLB shown in FIG. 8 (2 of 6);

DESCRIPTION OF THE PREFERRED EMBODIMENTS

Below, embodiments of a reconfigurable logic block (RLB), a programmable logic device having the RLB, and a method of fabricating the RLB in accordance with the present invention will be described in detail with reference to the accompanying drawings.

Figure 1:
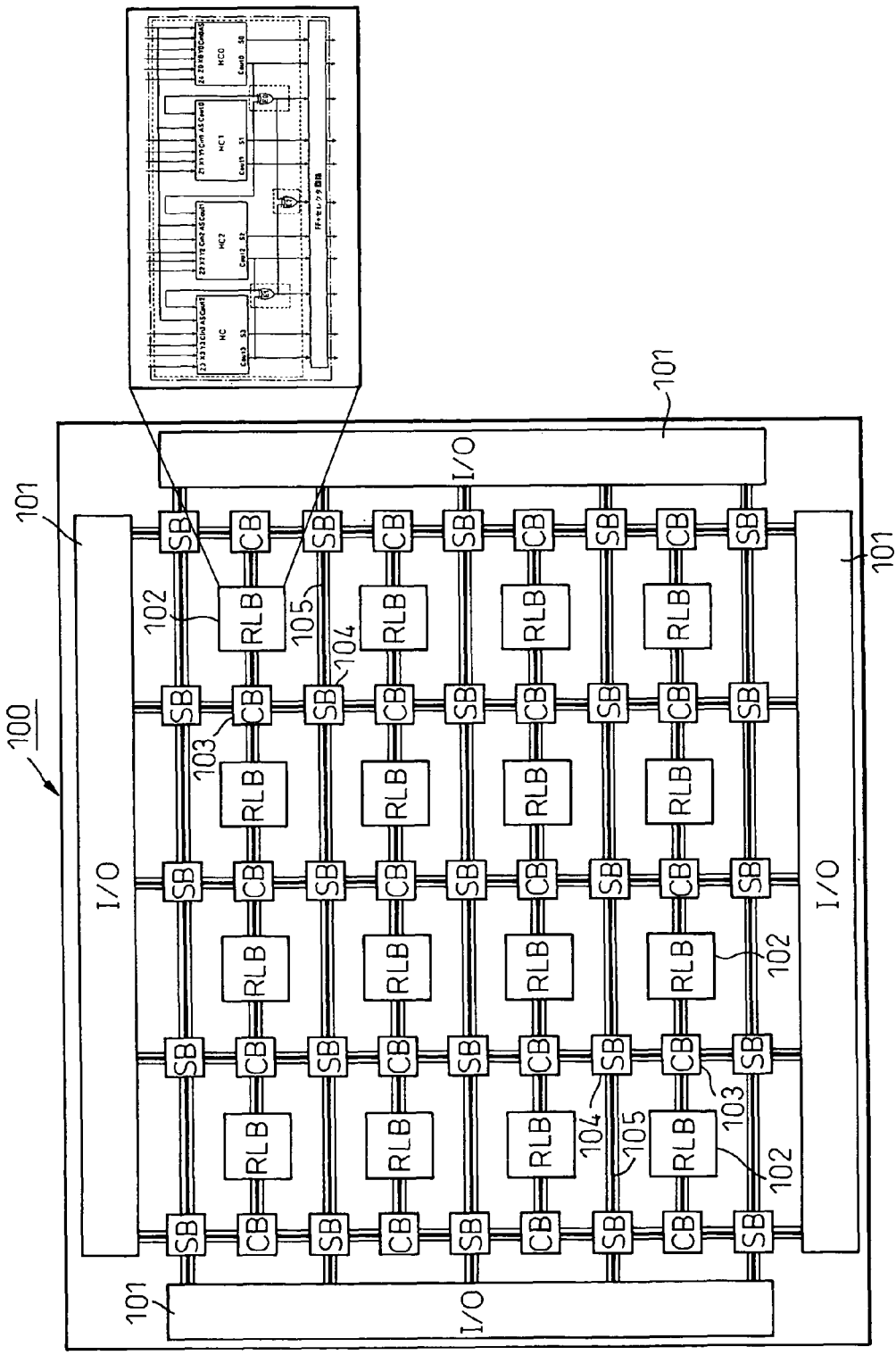
FIG. 1 is a block diagram of the overall configuration of an example of a programmable logic device to which the present invention is applied.

A block diagram of the entire configuration of a programmable logic device in which the present invention is used is shown in FIG. 1. In FIG. 1, reference number 100 denotes a programmable logic device, 101 denotes an input/output block (I/O block), 102 denotes an RLB, 103 denotes a connection block (CB), 104 denotes a switch block (SB), and 105 denotes wiring.

As shown in FIG. 1, the programmable logic device 100 is provided with a plurality of RLBs 102 arrayed in a matrix, CBs 103 that link each RLB 102 to the wiring 105, an SB 104 formed at each crossing point of the wiring 105, and I/O blocks 101 that input and output signals with respect to the exterior. Note that the present invention mainly relates to the configuration of the RLB 102.

Figure 2:
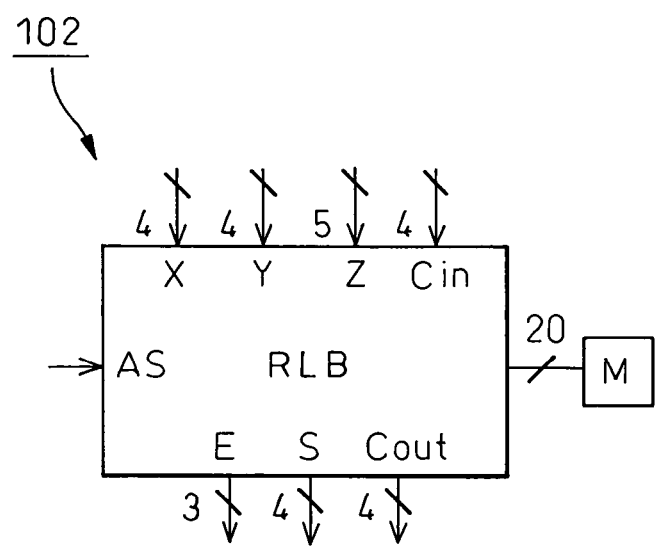
FIG. 2 is a block diagram of an example of the input-output configuration of a reconfigurable logic block (RLB) in accordance with the present invention.

A block diagram of an example of the input-output configuration of a reconfigurable logic block (RLB) is shown in FIG. 2.

The present invention is described below with respect to an example of an RLB having 18 inputs, 11 outputs, and 20 memory bits. In other words, the RLB 102 shown in FIG. 2 is provided with a total of 18 inputs which are four X inputs (X0 to X3), four Y inputs (Y0 to Y3), five Z inputs (Z0 to Z4), four Cin inputs (Cin0 to Cin3), and one AS input (AS); a total of 11 outputs which are three E outputs (E0 to E2), four S outputs (S0 to S3), and four Cout outputs (Cout0 to Cout3); and also 20 memory bits M (M0 to M19).

Note that the 18-input, 11-output, 20-memory RLB described below is just an example, and thus it should be obvious that the present invention can be applied to RLBs of various different configurations.

Figure 3:
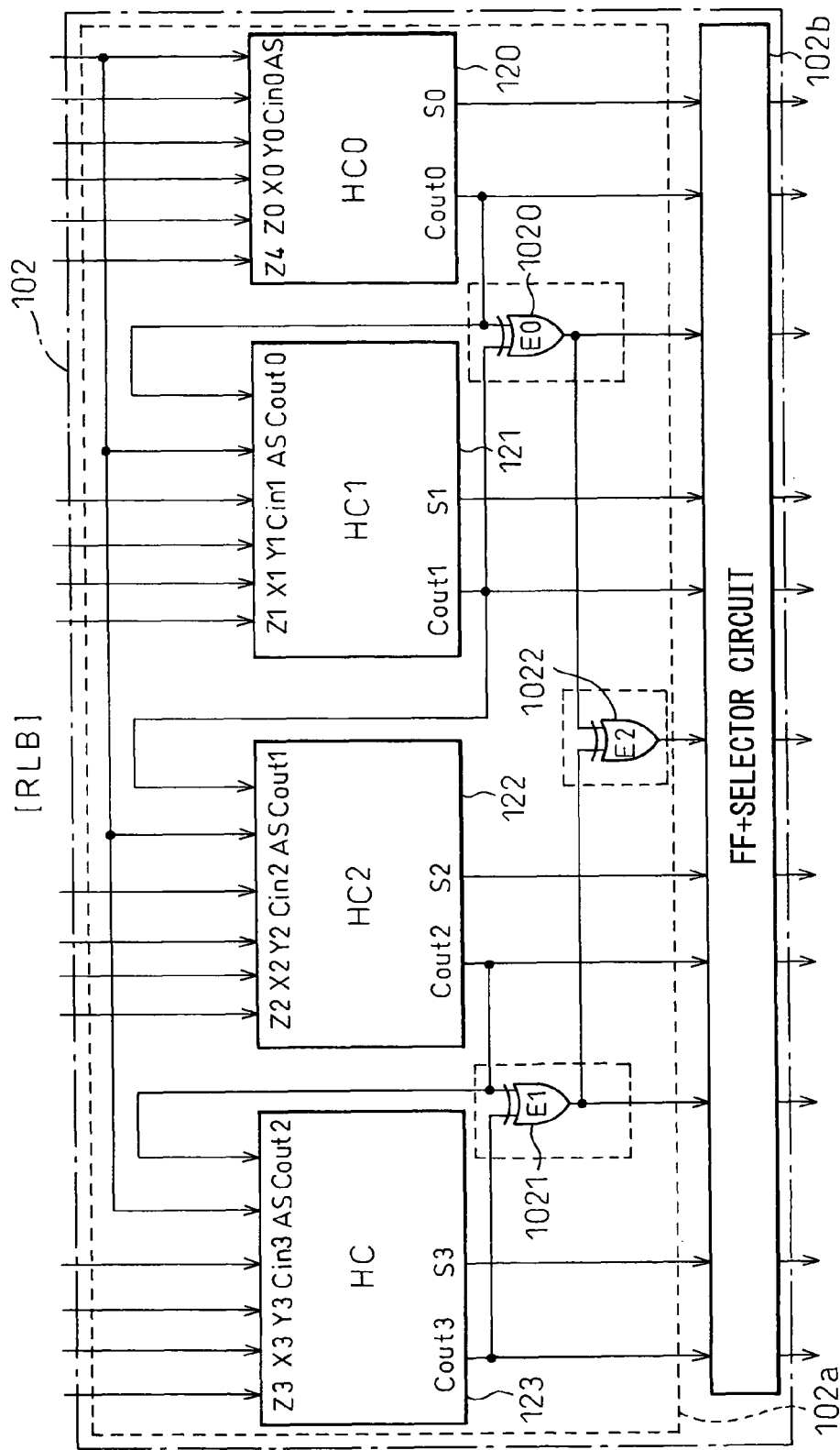
FIG. 3 is a block diagram of the configuration of the RLB of FIG. 2.

FIG. 3 is a block diagram of the configuration of the RLB shown in FIG. 2. In FIG. 3, reference number 102a denotes a combination logic portion, 102b denotes a flip-flop and selector circuit (FF+selector circuit), 120 to 123 denote hybrid cells (HC0 to HC3), and 1020 to 1022 denote exclusive OR (EXOR) circuits.

As shown in FIG. 3, the RLB 102 is provided with the combination logic portion 102a and the FF+selector circuit 102b, and the combination logic portion 102a is provided with the four hybrid cells 120 to 123 and the three EXOR circuits 1020 to 1022. The configuration is such that the EXOR circuit 1020 (E0) performs an exclusive OR of the carry output Cout0 of the hybrid cell 120 and the carry output Cout1 of the hybrid cell 121, the EXOR circuit 1021 (E1) performs an exclusive OR of the carry output Cout2 of the hybrid cell 122 and the carry output Cout3 of the hybrid cell 123, and the EXOR circuit 1022 (E2) performs an exclusive OR of the output of the EXOR circuit 1020 and the output of the EXOR circuit 1021.

FIGS. 4A and 4B and FIGS. 5A and 5B are illustrative of models of the hybrid cells shown in FIG. 3, where FIG. 4A shows a 2-input Reed-Muller canonical form (fine-grain) of circuit that can representational logic similar to a 2-LUT, FIG. 5A shows a one-bit adder (coarse-grain), and FIGS. 4B and 5B are models of hybrid cells (HC0 to HC3) applied to embodying examples that are described below. In this case, data corresponding to the inputs and outputs thereof is stored in the memory bits M0 to M3 in FIGS. 4A and 4B.

In other words, the memory bits M0 to M3 in the 2-input Reed-Muller canonical form of logic circuit are allocated as follows:

$$F(x_0, x_1) = F(0,0) \rightarrow M3$$

$$\oplus x_0\{F(0,0) \oplus F(1,0)\} \rightarrow M2$$

$$\oplus x_1\{F(0,0) \oplus F(0,1)\} \rightarrow M1$$

$$\oplus x_0 \cdot x_1\{F(0,0) \oplus F(0,1) \oplus F(1,0) \oplus F(1,1)\} \rightarrow M0$$

In addition, the 2-input Reed-Muller canonical form of circuit shown in FIG. 4A can be configured of setting a logic pattern and inputs by the hybrid cell shown in FIG. 4B, and the one-bit full adder shown in FIG. 5A can be configured of setting a logic pattern and inputs by the hybrid cell shown in FIG. 5B.

Figures 6A, 6B, 6C:
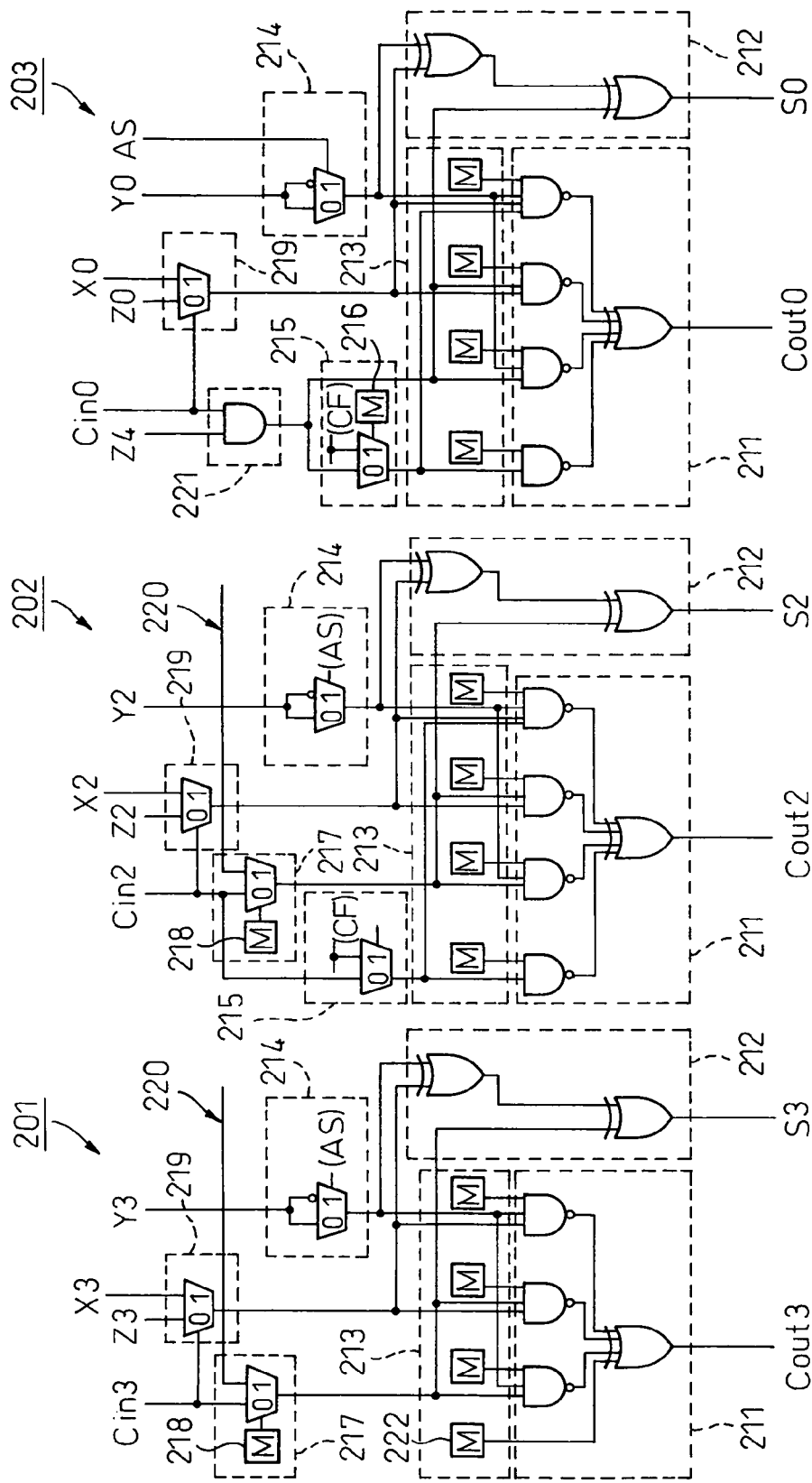
FIGS. 6A, 6B, and 6C are logical circuit diagrams of examples of the configuration of RLBs in accordance with the present invention.

Logic circuit diagrams of examples of the configuration of hybrid cells in RLB relating to the present invention are shown in FIGS. 6A, 6B, and 6C, where FIGS. 6A to 6C show examples of three types of hybrid cell HC based on the hybrid cell models shown in FIGS. 4B and 5B.

In FIGS. 6A to 6C, reference numbers 201 to 203 denote hybrid cells; 211 denotes a carry-out arithmetic circuit; 212 denotes an adder arithmetic circuit; 213, 216, 218, and 222 denote configuration memory bits (M); 214 denotes an adder/subtractor selector circuit; 215 denotes a fine-grain/coarse-grain switching circuit; 217 denotes a carry path selector circuit; 219 denotes an input selector circuit; 220 denotes a carry path; and 221 denotes an AND circuit. In this case, the AND circuit 221 is a circuit that is necessary for representing a 4-input Reed-Muller canonical form of logic circuit and the one-bit configuration memory bit 222 inputs the inverse of the configuration pattern for the Reed-Muller canonical form of circuit. However, the configuration memory bit 222 is the only one to use the inverse.

Figure 7:
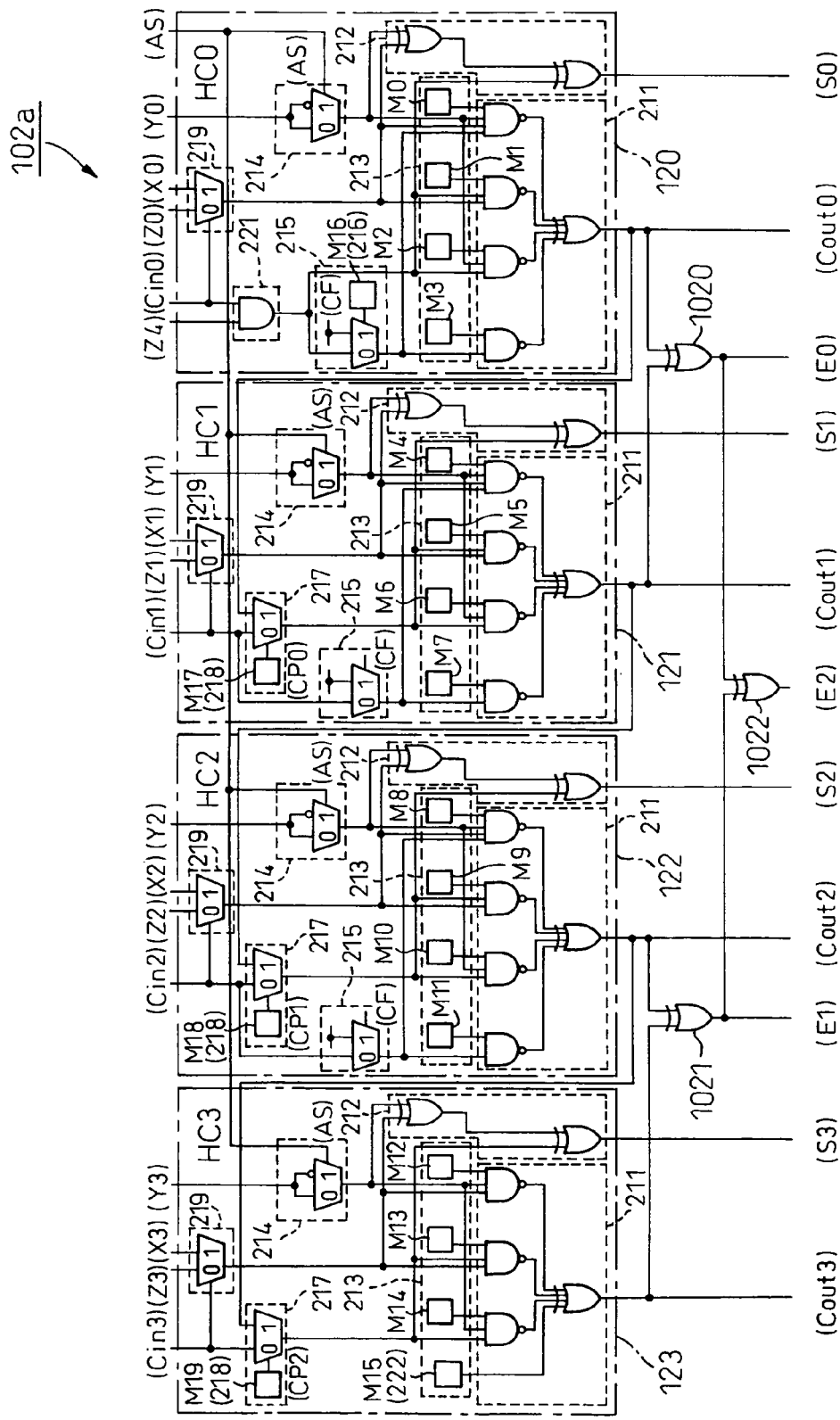
FIG. 7 is a logical circuit diagram of the configuration of one embodying example of an RLB in accordance with the present invention.

A logical circuit diagram of the configuration of an embodying example of the RLB in accordance with the present invention is shown in FIG. 7, where the three types of hybrid cell shown in FIGS. 6A to 6C are combined to form the combination logic portion 102a of the RLB 102 shown in FIG. 3.

In this case, as is clear from a comparison of FIG. 7 and FIGS. 6A to 6C, the hybrid cell 120 (HC0) of FIG. 7 corresponds to the hybrid cell 203 shown in FIG. 6C, the hybrid cells 121 (HC1) and 122 (HC2) of FIG. 7 each correspond to the hybrid cell 202 Shown in FIG. 6B, and the hybrid cell 123 (HC3) of FIG. 7 corresponds to the hybrid cell 201 shown in FIG. 6A.

As shown in FIGS. 7 and 3, the EXOR circuit 1020 performs an exclusive OR of the carry output Cout0 of the hybrid cell 120 and the carry output Cout1 of the hybrid cell 121, and outputs the signal E0; the EXOR circuit 1021 performs an exclusive OR of the carry output Cout2 of the hybrid cell 122 and the carry output Cout3 of the hybrid cell 123, and outputs the signal E1; and the EXOR circuit 1022 performs an exclusive OR of the output signal E0 of the EXOR circuit 1020 and the output signal E1 of the EXOR circuit 1021, and outputs the signal E2.

This configures the combination logic portion 102a of the RLB (in other words, the RLB 102) that has a total of 18 inputs which are four X inputs X0 to X3, four Y inputs Y0 to Y3, five Z inputs Z0 to Z4, four Cin inputs Cin0 to Cin3, and one AS input AS; a total of 11 outputs which are three E outputs E0 to E2, four S outputs S0 to S3, and four Cout outputs Cout0 to Cout3; and 20 memory bits M0 to M19.

A block diagram of circuit functions that can be implemented by the RLB of FIG. 7 is shown in FIG. 8.

As shown in FIG. 8 by way of example, circuits having various different functions can be configured of the RLB 102 (the combination logic portion 102a) of FIG. 7, such as a ripple carry adder type of 4-bit adder/subtractor, in other words, a 4-bit arithmetic logic unit (ALU) as shown in FIG. 8(a); four multiplexers (MUXes) as shown in FIG. 8(b); a 4-input canonical form of LUT (a Reed-Muller canonical form of 4-LUT) as shown in FIG. 8(c); two 3-LUTs as shown in FIG. 8(d); four 2-LUTs as shown in FIG. 8(e); one 3-LUT and two 2-LUTs as shown in FIG. 8(f); or another type of logic circuit as shown in FIG. 8(g).

FIGS. 9A to 14B show examples of circuits that are each configured of the RLB shown in FIG. 8 (the combination logic portion 102a of the RLB 102), wherein the FF+selector circuit 102b of the RLB 102 is omitted from these FIGS. 9A to 14B.

Figures 9A, 9B:
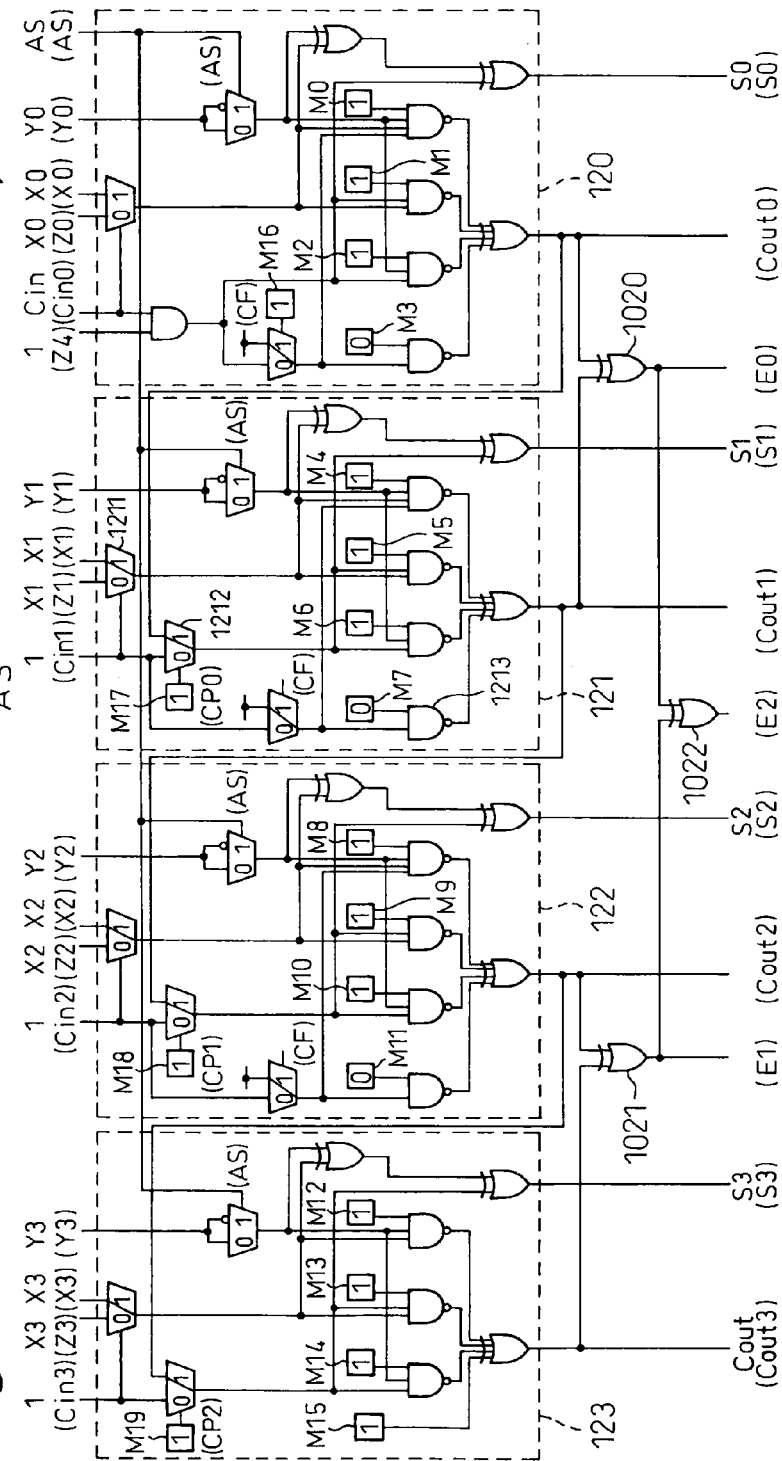
FIGS. 9A and 9B show an example of a circuit configured of the RLB shown in FIG. 8 (1 of 6)

FIGS. 9A and 9B show the 4-bit ALU of FIG. 8(a), where FIG. 9A shows the function block of the 4-bit ALU and FIG. 9B shows the input-output signals and logic pattern when the circuitry is configured from the combination logic portion 102a shown in FIG. 7. In this case, the logic pattern is represented by data stored in the 20 memory bits M0 to M19 (20 bits, where high-level data is "1" and low-level data is "0"). Note that this configuration becomes an adder when AS is 0, or a subtractor when AS is 1.

In other words, to configure the 4-bit ALU from the combination logic portion 102a of FIG. 7, data "1" is written to the memory bits M0 to M2, M4 to M6, M8 to M10, and M12 to M19 and data "0" is written to the memory bits M3, M7, and M11. In addition, the inputs Z4, Cin1, Cin2, and Cin3 are pulled up to a high-potential source (Vdd: data "1"); the same signal X0 is supplied to the inputs X0 and Z0; the same signal X1 is supplied to the inputs X1 and Z1; the same signal X2 is supplied to the inputs X2 and Z2; and the same signal X3 is supplied to the inputs X3 and Z3. Note that the inputting (setting) of write data into the memory bits M0 to M19 could be done by applying any of various different methods that are known in the art.

Concentrating on the hybrid cell 121 in this case, by way of example, since the same input signal X1 is supplied to both of the inputs X1 and Z1 and also a control terminal connected to the input Cin1 is fixed to data "1", a selector 1211 selects and outputs the input X1 on the data "1" side (but note that since the same signal X1 is input to both inputs X1 and Z1, this is the same X1). Since a control terminal of another selector 1212 is fixed to the data "1" stored in the memory bit M17, the selector 1212 selects the carry output C0 of the hybrid cell 120. In addition, since one input of a 2-input NAND gate 1213 is fixed to the data "0" stored in the memory bit M7, the output thereof is always data "1".

In this manner, a 4-bit ALU can be configured of the combination logic portion 102a (the RLB 102) of FIG. 7, by setting the input-output signals and the data pattern stored in the memory bits M1 to M19 to predetermined values. Note that carry paths can be linked within the RLB 102 (the combination logic portion 102a) when configuring a 4-bit ALU, enabling high-speed operation, as is clear from FIG. 9B.

FIGS. 10A and 10B show the four MUXes of FIG. 8(b), where FIG. 10A shows the function block of one MUX and FIG. 10B shows the input-output signals and the logic pattern when the circuitry is configured from the combination logic portion 102a shown in FIG. 7.

In other words, to configure the four MUXes from the combination logic portion 102a shown in FIG. 7, data "1" is written to the memory bits M0, M4, M8, M12, M15, and M16 and data "0" is written to the memory bits M1 to M3, M5 to M7, M9 to M11, M13, M14, and M17 to M19.

Figure 11A:
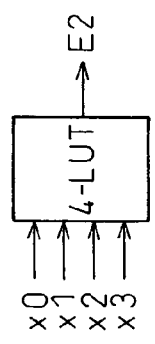
FIGS. 11A and 11B show another example of a circuit configured of the RLB shown in FIG. 8 (3 of 6)
Figure 11B:
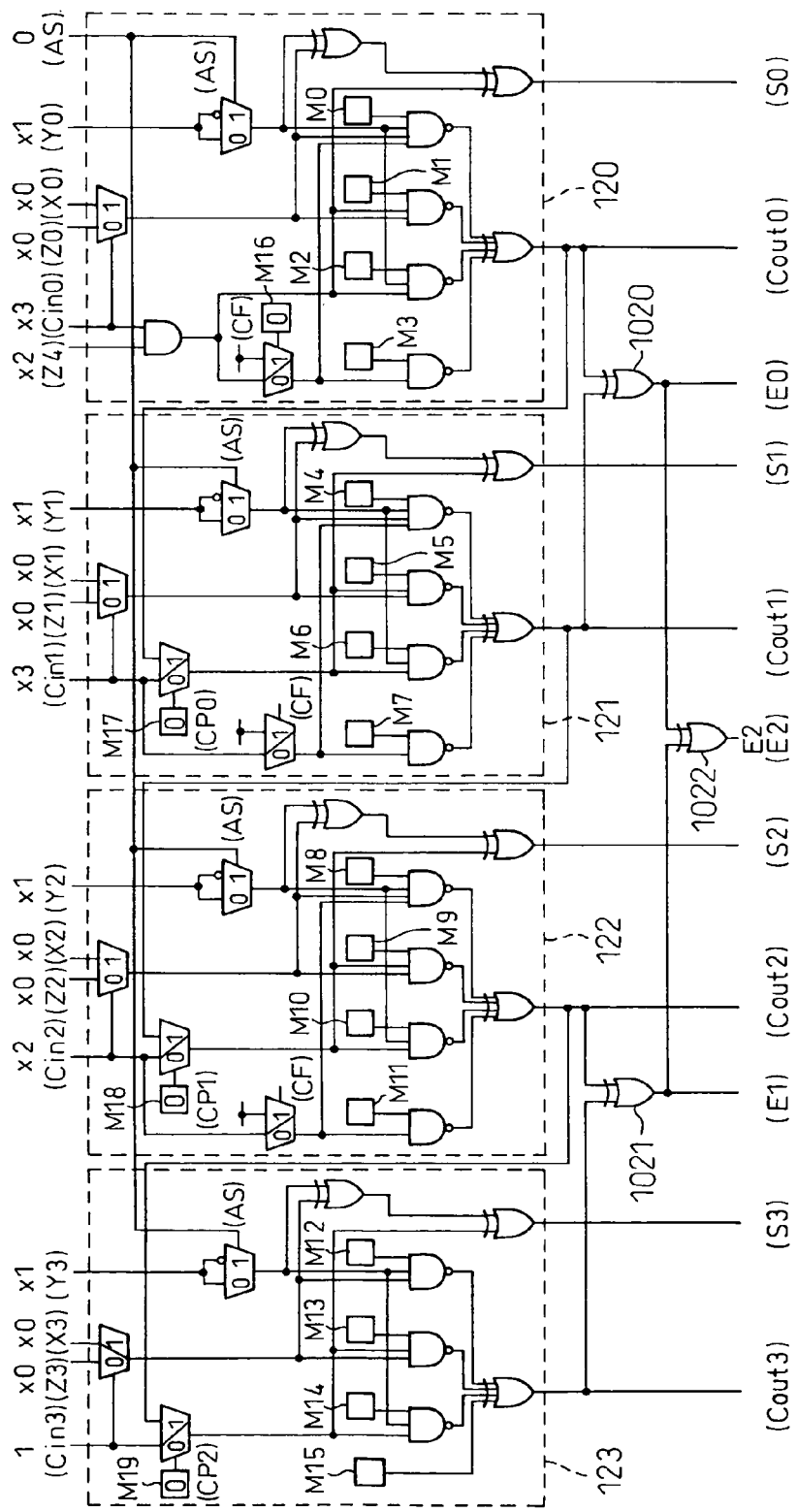

FIGS. 11A and 11B show the one 4-LUT of FIG. 8(c), where FIG. 11A shows the function block of the 4-LUT and FIG. 11B shows the input-output signals and the logic pattern when the circuitry is configured from the combination logic portion 102a shown in FIG. 7.

In other words, to configure one 4-LUT from the combination logic portion 102a shown in FIG. 7, data that would obtain the necessary input-output relationships for that LUT is written to the memory bits M0 to M15, and data "0" is written to memory bits M16 to M19. In addition, the one 4-LUT shown in FIG. 7 can be configured by setting the input-output signals as shown in FIG. 11B.

Figures 12A, 12B:
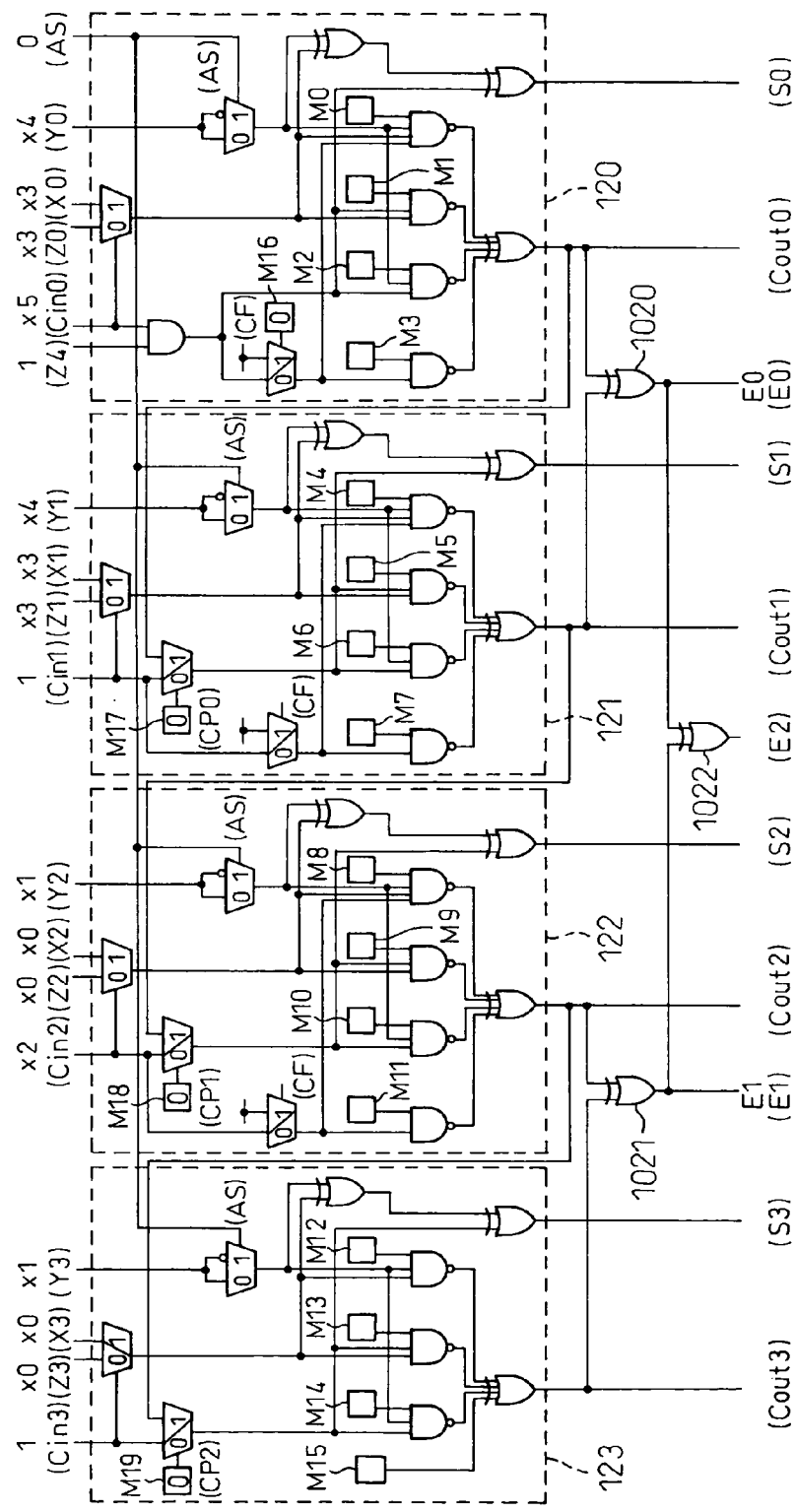
FIGS. 12A and 12B show another example of a circuit configured of the RLB shown in FIG. 8 (4 of 6)
Figure 13A:
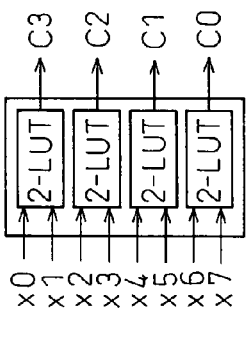
FIGS. 13A and 13B show another example of a circuit configured of the RLB shown in FIG. 8 (5 of 6)
Figure 13B:
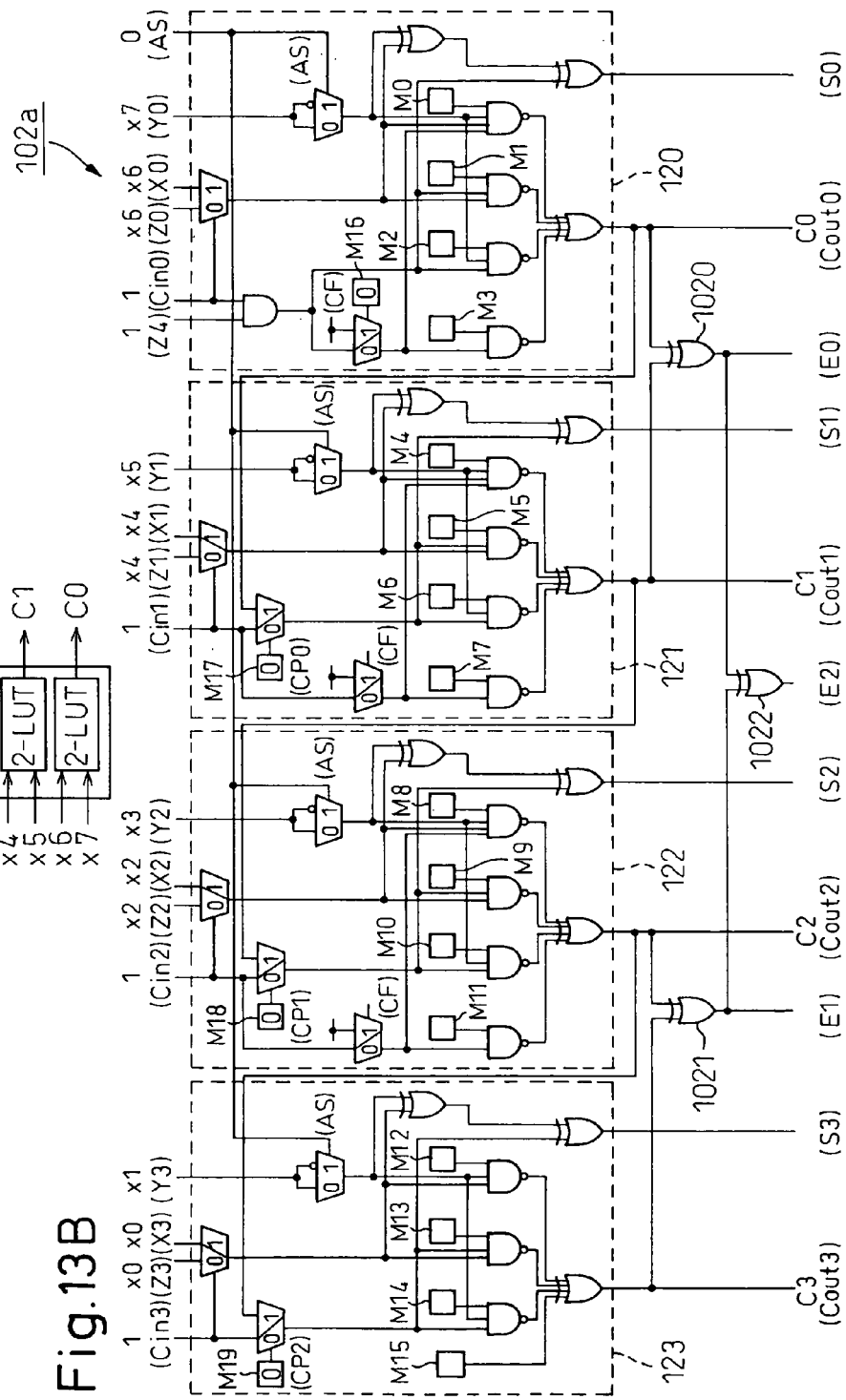
Figure 14A:
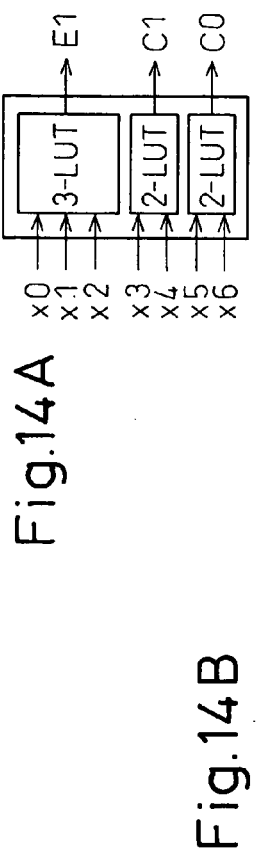
FIGS. 14A and 14B show another example of a circuit configured of the RLB shown in FIG. 8 (6 of 6)
Figure 14B:
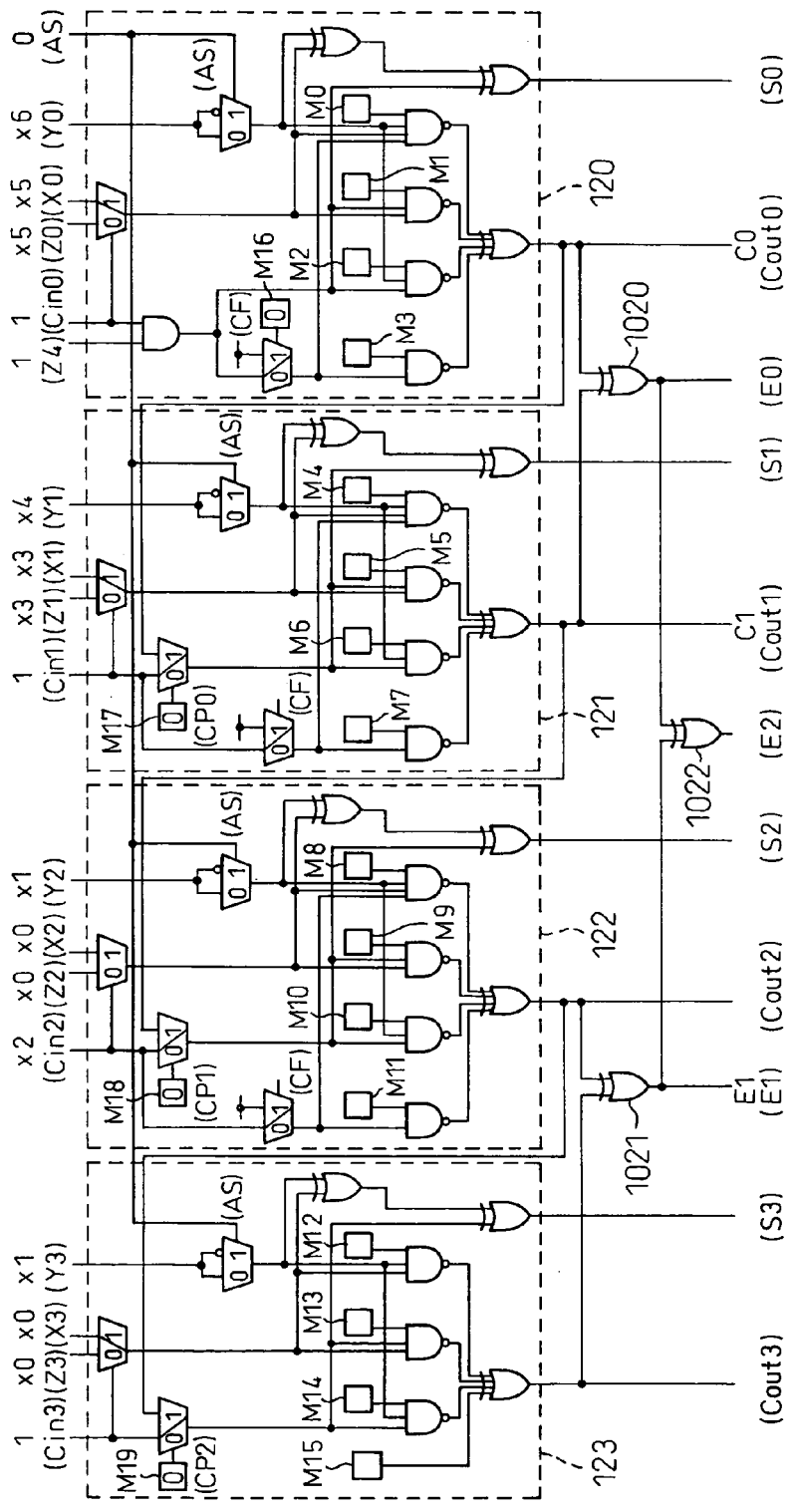

FIGS. 12A to 14B are similar in that FIGS. 12A and 12B show the two 3-LUTs of FIG. 8(d), FIGS. 13A and 13B show the four 2-LUTs of FIG. 8(e), and FIGS. 14A and 14B show the one 3-LUT and two 2-LUTs of FIG. 8(f). Each of FIGS. 12A, 13A, and 14A shows a function block and FIGS. 12B, 13B, and 14B show the input-output signals and the logic pattern when the corresponding circuitry is configured from the combination logic portion 102a shown in FIG. 7.

Note that in addition to the circuits shown in FIGS. 9A to 14B, the combination logic portion 102a can be used to configure various different circuits. In addition, the combination logic portion 102a (the RLB 102) of FIG. 7 is merely shown as an example and thus the RLB itself can have various different configurations.

As described above, the reconfigurable logic block (RLB) in accordance with the present invention or a programmable logic device provided with such an RLB makes it possible to implement various different types of LUT having pluralities of inputs, due to the provision of the memory bits M0 to M19 within the RLB 102 (the combination logic portion 102a), unlike with LUTs that use FPGAs of the prior art, by way of example. This enables configuration with an LUT of the number of signals as appropriate for the necessary circuitry, preventing any increase in implementation area. In addition, the connections between the neighboring hybrid cells 120 to 123 can be implemented by wiring within each 102, without passing through a wiring area outside of the block, enabling high-speed operation.

In other words, the RLB (programmable logic device) of this embodying example enables the configuration of cells that are similar to various different LUTs, such as one 4-LUT (see FIGS. 11A and 11B), two 3-LUTs (see FIGS. 12A and 12B), four 2-LUTs (see FIGS. 13A and 13B), or one 3-LUT and two 2-LUTs (see FIGS. 14A and 14B), by using the hybrid cells 120 to 123 as a canonical form (such as a Reed-Muller canonical form) of logic circuit, and can also be configured as other types of logic circuit. Note that when this RLB is used as other types of logic circuit, it is possible to representational logic that is limited to a maximum of four inputs for one hybrid cell, by utilizing the gate architecture of the hybrid cells.

As described above, various difference circuits can be configured as necessary with one programmable logic device, by setting the input-output signals and logic pattern in the RLB, but the present invention doesn't provide just such an RLB and programmable logic device; it can also provide an application specific integrated circuit (ASIC) or structured ASIC.

In other words, it is possible to facilitate the provision of an ASIC (or structured ASIC) having an area efficiency that is even more improved over that of a programmable logic device, by configuring circuitry that fixes the input-output signals and logic pattern in each RLB, in other words, by providing wiring corresponding to the circuitry necessary for wiring the input signals, and also by erasing the memory bits (M0 to M19) that determine the circuit functions then fixing them to levels corresponding to the input signals and the data of the memory bits (M0 to M19).

All the logic patterns that can be represented by one hybrid cell are shown in Table 1.

TABLE 1

| | | Logic Patterns for One Hybrid Cell (CP = 0) | | | | | |
|---|---|---|---|---|---|---|---|
| | | 4-variable input | | 3-variable input | | 2-variable input | |
| CF | AS | Cout | S | Cout | S | Cout | S |
| 1 | 0 | 182/65,536 | 24/65,536 | 120/256 | 43/256 | 16/16 | 16/16 |
| | 1 | 230/65,536 | 24/65,536 | 148/256 | 43/256 | 16/16 | 16/16 |
| 0 | 0 | 123/65,536 | 24/65,536 | 63/256 | 43/256 | 16/16 | 16/16 |
| | 1 | 123/65,536 | 24/65,536 | 63/256 | 43/256 | 16/16 | 16/16 |

In other words, when CF is 1, the switching of AS enables the representation of a total of 16 patterns with two variables, 206 out of 256 different output logic patterns with three variables, or 446 out of 65536 different output logic patterns with four variables. Thus just about any circuit can be configured by one hybrid cell if there are three variables, by way of example, and the use of four variables makes it possible to create configurations with a single hybrid cell.

Furthermore, the use of carry paths and EXOR circuits makes it possible to represent multi-input logic with a plurality of hybrid cells.

Table 2 is a truth table and Table 3 shows examples of logic patterns and inputs for when devices are represented by one hybrid cell as shown in FIG. 6B.

TABLE 2

| Input | | | Output | |
|---|---|---|---|---|
| A | B | C | Y | |
| 0 | 0 | 0 | 0 | |
| 0 | 0 | 1 | 0 | |
| 0 | 1 | 0 | 0 | |
| 0 | 1 | 1 | 0 | Logic Pattern |
| 1 | 0 | 0 | 0 | |
| 1 | 0 | 1 | 0 | |
| 1 | 1 | 0 | 0 | |
| 1 | 1 | 1 | 1 | |

TABLE 3

Representational Logic Output of One Hybrid Cell:
Cout(CF = 0, AS = 0, CP = 0 )

| Logic Pattern | SRAM[3:0] | Input | | | |
|---|---|---|---|---|---|
| 00000000 | SRAM = 0000 | Cin = A | Z = A | X = B | Y = C |
| 00000001 | SRAM = 0011 | Cin = A | Z = A | X = B | Y = C |
| 00000010 | SRAM = 0001 | Cin = A | Z = A | X = B | Y = C |
| 00000011 | SRAM = 0010 | Cin = A | Z = A | X = B | Y = C |
| . | . | . | . | . | . |
| . | . | . | . | . | . |
| 11111100 | SRAM = 1011 | Cin = 1 | Z = C | X = A | Y = B |
| 11111111 | SRAM = 1000 | Cin = 1 | Z = A | X = B | Y = C |

The array of logic patterns in Table 3 can be represented by four memory bits M0 to M3 (SRAM[3:0]), based on a truth table such as that of Table 2. Note that the values of these memory bits M0 to M3 are written to the memory bits M0 to M3 in the hybrid cell of FIG. 4B, by way of example.

In this case, flash electrically erasable and programmable read only memory (EEPROM) or static random access memory (SRAM) could be used as the memory, by way of example. Note that the writing of logic patterns (data) to each memory bit can be done by applying any of various different methods that are known in the art. For example, data setting (writing) with respect to volatile memory such as SRAM can be used after initialization at power on has ended, or the data could be set beforehand into non-volatile memory such as an EEPROM before the device is used in practice.

Figure 15A:
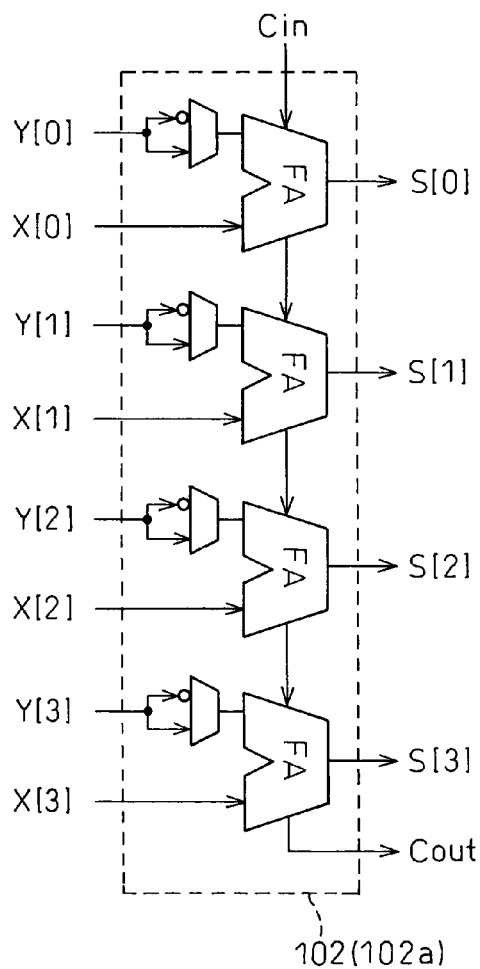
FIGS. 15A and 15B show examples of circuits configured by applying an example of an RLB in accordance with the present invention (1 of 2)
Figure 15B:
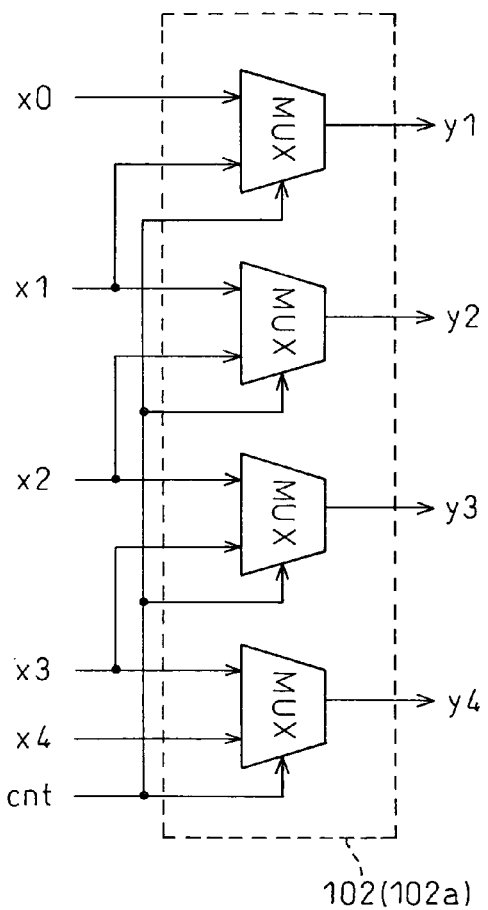

Examples of circuits configured by applying an example of an RLB in accordance with the present invention are shown in FIGS. 15A and 15B, where FIG. 15A shows a 4-bit adder/subtractor and FIG. 15B shows a one-bit-right shifter.

Eight LUTs are necessary when configuring a 4-bit adder/subtractor from LUTs of a prior-art FPGA (which is assumed to use a 4-input, 1-output LUT for each RLB), but this embodying example ensures that a 4-bit adder/subtractor can be configured with just one RLB 102 (the combination logic portion 102a), as shown by way of example in FIG. 15A (see the previously mentioned FIGS. 9A and 9B).

Similarly, four LUTs (RLBs) are necessary when allocating LUTs of a prior-art FPGA to a four 2-input, 1-output MUX circuit, but this embodying example ensures that the same can be configured of just one RLB 102, as shown by way of example in FIG. 15B (see the previously mentioned FIGS. 10A and 10B). Note that the one-bit-right shifter shown in FIG. 15B can be configured by connecting four MUXes (see FIGS. 10A and 10B (or, FIG. 8(b)) as shown in the figure.

In this manner, the reconfigurable logic block (RLB) of this embodying example makes it possible to configure devices such as the 4-bit adder/subtractor of FIG. 15A or the one-bit-right shifter of FIG. 15B from a single RLB 102, enabling an improvement in the area efficiency thereof.

Figure 16A:
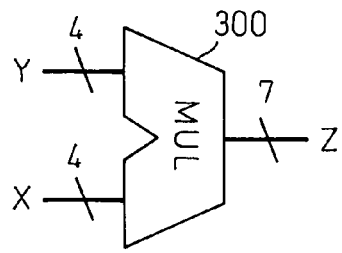
FIGS. 16A and 16B show a further example of a circuit configured by applying an example of an RLB in accordance with the present invention (2 of 2)
Figure 16B:
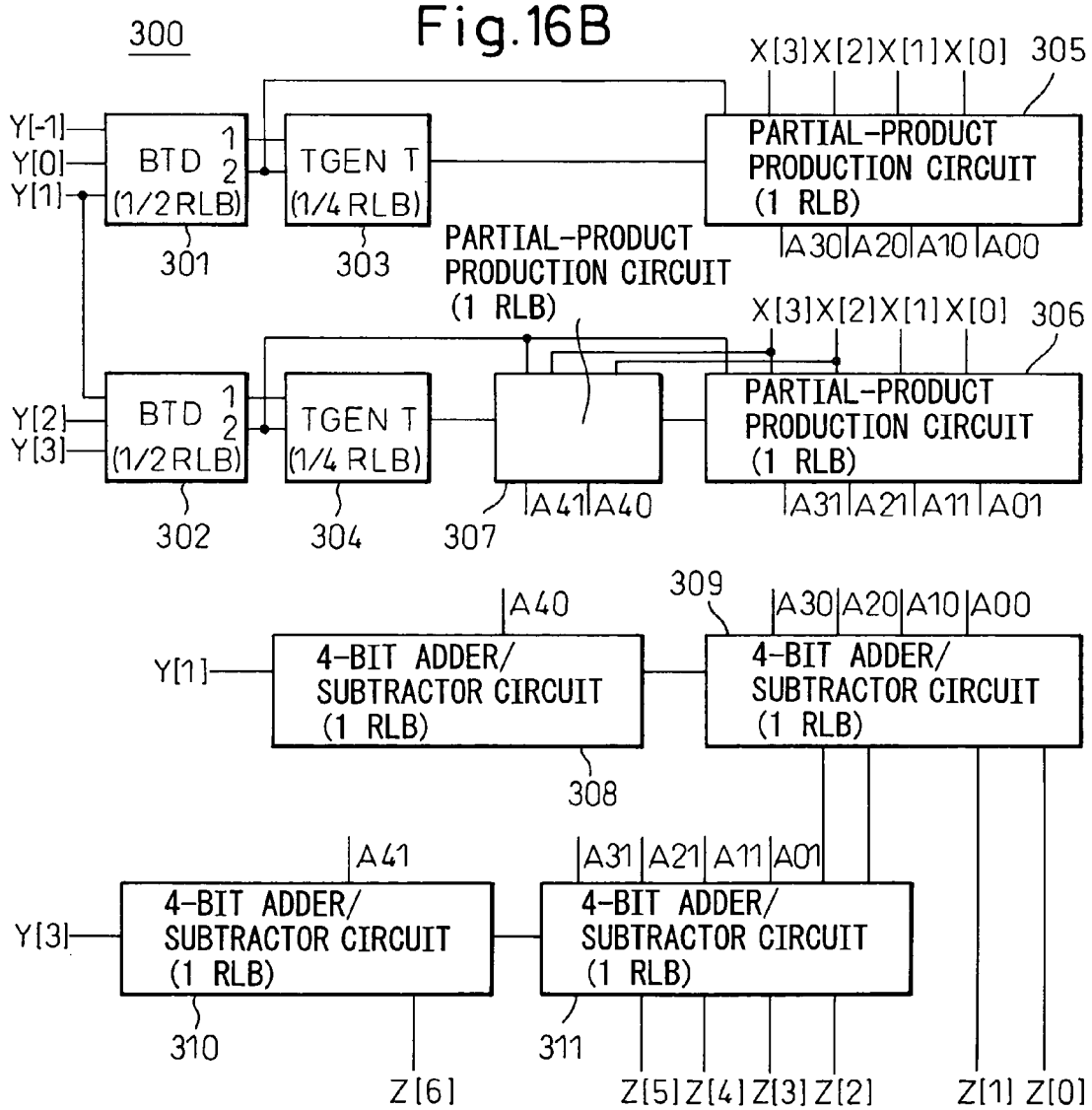

A further example of a circuit configured by applying an example of an RLB in accordance with the present invention are shown in FIGS. 16A and 16B, where FIG. 16A shows the function block of a 4-bit multiplier (MUL) and FIG. 16B shows the circuit configuration of a 4-bit multiplier 300 to which a secondary Booth algorithm is applied.

As shown in FIG. 16B, the 4-bit multiplier 300 to which the secondary Booth algorithm is applied is provided with Booth decoders (BTD) 301 and 302; timing generators (TGENs) 303 and 304; partial-product creation circuits 305, 306, and 307; and 4-bit adder/subtractor circuits 308, 309, 310, and 311. Note that the BTDs 301 and 302 are blocks that generate decoded values that are necessary for Booth operations from connected 3-bit multipliers, and the TGENs 303 and 304 are blocks that generate reference values T for selecting multiplicands that are necessary for obtaining partial products, based on the values of the BTDs 301 and 302. The partial-product creation circuits 305, 306, and 307 are blocks that create the partial products necessary for multiplications, from the outputs of the BTDs 301 and 302 and the TGENs 303 and 304.

In this case, each of the BTDs 301 and 302 can be configured of half of an RLB 102 (0.5×2=1×RLB) and each of the TGENs 303 and 304 can be configured of one-quarter of an RLB 102 (0.25×2=0.5×RLB). In addition, each of the partial-product creation circuits 305, 306, and 307 can be configured of one CBL 102 (1×3=3×RLB) and each of the 4-bit adder/subtractor circuits 308, 309, 310, and 311 can also be configured of one CBL 102 (1×4=4×RLB).

Thus the 4-bit multiplier 300 of FIG. 16B can be configured of: 1×RLB+0.5×RLB+3×RLB+4×RLB=8.5×RLB (8.5 RLBs). If the remaining half RLB (0.5×RLB) that is not being used for the 4-bit multiplier 300 in this case cannot be allocated for use in another circuit, nine RLBs can be used in the configuration. It is therefore clear that nine RLBs 102 of this embodying example would be sufficient for configuring a 4-bit multiplication circuit to which the secondary Booth algorithm is applied.

In this manner, the area efficiency can be improved not only by using LUTs for the combination combination logic portions as far as possible, but also by using them as cells in which the gate architecture thereof is employed (equivalent to the other logic circuit shown in FIG. 8(*g*))

Figure 17:
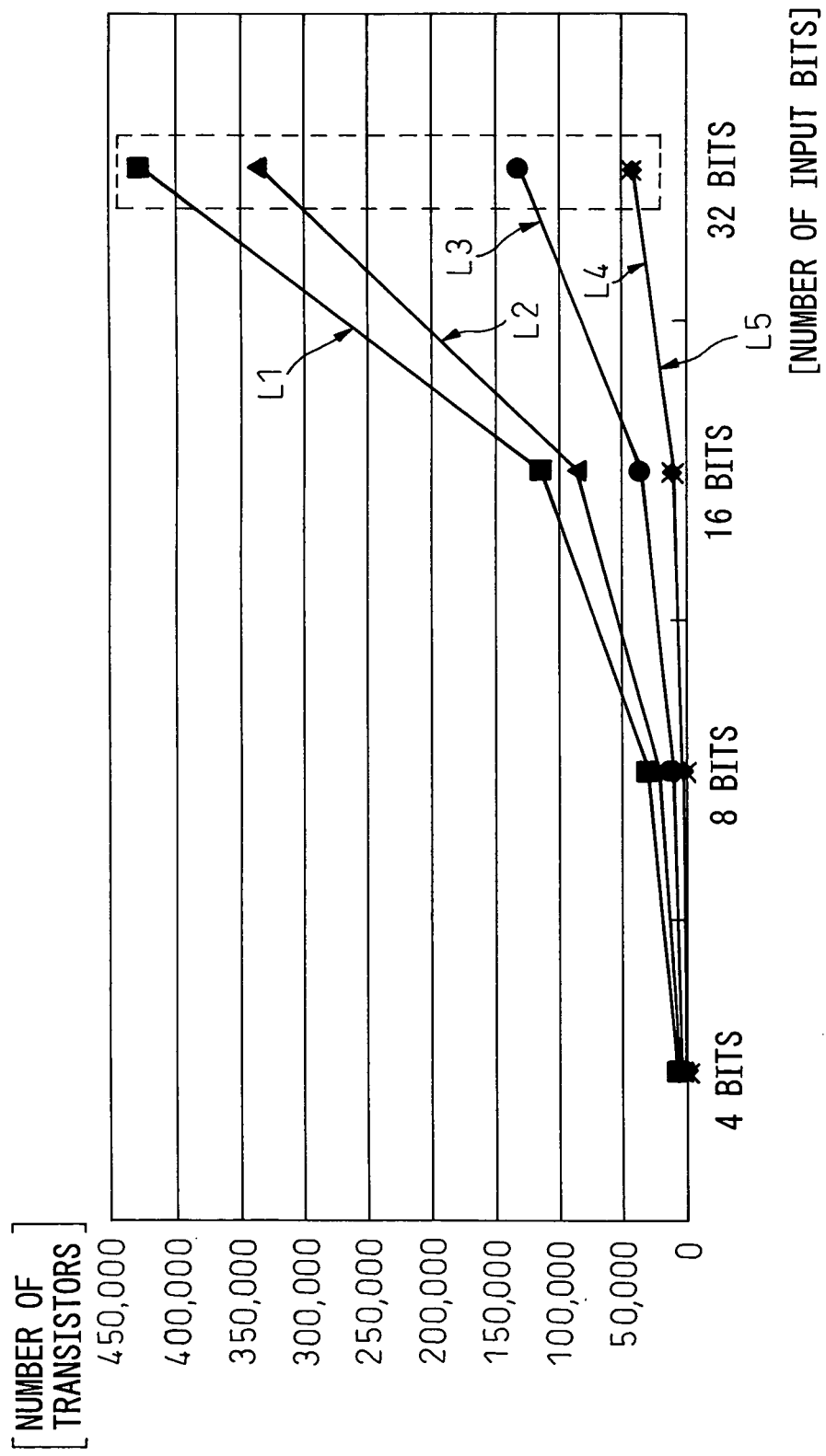
FIG. 17 is a graph comparing the numbers of transistors in configurations of signed multipliers.

A graph of comparisons of the numbers of transistors used when configuring signed multipliers is shown in FIG. 17, showing the numbers of transistors when various different methods are used to implement signed multipliers of 4 to 32 bits. In FIG. 17, reference numbers L1 to L4 denote plotted lines, where L1 shows the number of transistors when configuring a device that uses a 4-LUT for direct multiplication in a prior-art programmable logic device; L2 shows the number of transistors when configuring a device that uses a 4-LUT for direct multiplication in another prior-art programmable logic device; L3 shows the number of transistors when configuring a device with a Booth algorithm that uses the RLB 102 in a programmable logic device in accordance with the present invention as described above; L4 shows the number of transistors when configuring a device with a Booth algorithm, using a prior-art ASIC method; and L5 shows the number of transistors when configuring a device with direct multiplication, using a prior-art ASIC method.

As is clear from FIG. 17, the number of transistors (L2) of the signed multiplier configured of the RLB 102 of this embodying example is somewhat worse (the number of transistors is greater) than the number of transistors (L4) of the ASIC, but the number of transistors can be greatly reduced in comparison with the numbers of transistors (L1 and L2) of programmable logic devices of the prior art. It is clear that the effect of this reduction in the numbers of transistors is of course dramatic as the number of bits of the signed multipliers increases. With a 32-bit signed multiplier, by way of example, the use of the RLB 102 of this embodying example enables a reduction of approximately 70% in the number of transistors of the signed multiplier, in comparison with prior-art direct multiplication (4-LUT) device, or a reduction of approximately 62% in comparison with a prior-art Booth algorithm (4-LUT) device.

The description above was based on the reconfigurable logic block (RLB) shown in FIG. 2, but the RLB is not to be taken as limited to the input-output configuration shown in FIG. 2.

The present invention is described further below, with respect to other examples of RLBs that have input-output configurations that differ from those of FIG. 2, with reference to FIGS. 18 to 25B.

Figure 18:
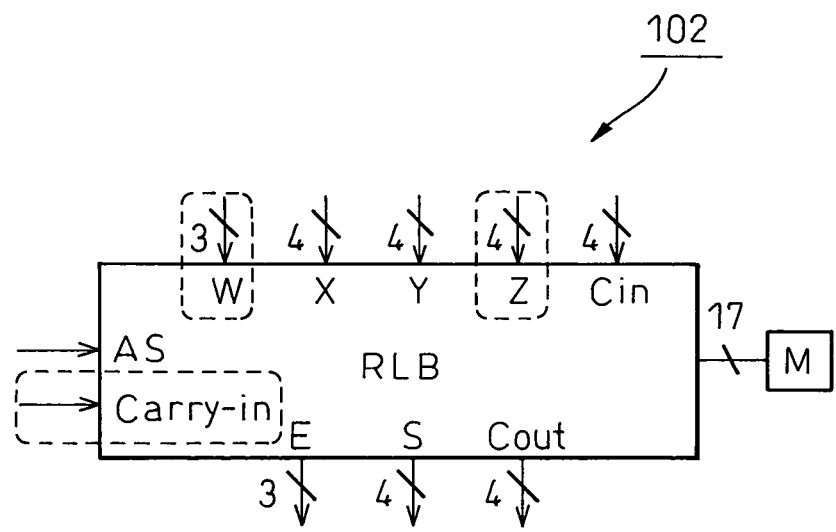
FIG. 18 is a block diagram of another example of the input-output configuration of an RLB in accordance with the present invention.

A block diagram of another example of the input-output configuration in an RLB in accordance with the present invention is shown in FIG. 18, relating to a 21-input, 11-output, 17-memory RLB.

The RLB 102 shown in FIG. 18 is provided with a total of 21 inputs which are three W inputs (W0 to W2), four X inputs (X0 to X3), four Y inputs (Y0 to Y3), four Z inputs (Z0 to Z3), four Cin inputs (Cin0 to Cin3), one AS input (AS), and one Carry-in input (Carry-in); a total of 11 outputs which are three E outputs (E0 to E2), four S outputs (S0 to S3), and four Cout outputs (Cout0 to Cout3); and also 17 memory bits M (M0 to M16).

In other words, it is clear from a comparison of FIG. 2 and FIG. 18 that the RLB of FIG. 18 has three W inputs and one Carry-in input in addition, the five Z inputs are reduced to four Z inputs, and also the memory bits M are reduced from 20 to 17. Note that the 18-input, 11-output, 20-memory RLB of FIG. 2 and the 21-input, 11-output, 17-memory RLB of FIG. 18 are merely representative examples, and thus the present invention can be applied to RLBs of various different configurations, as mentioned previously.

Figure 19:
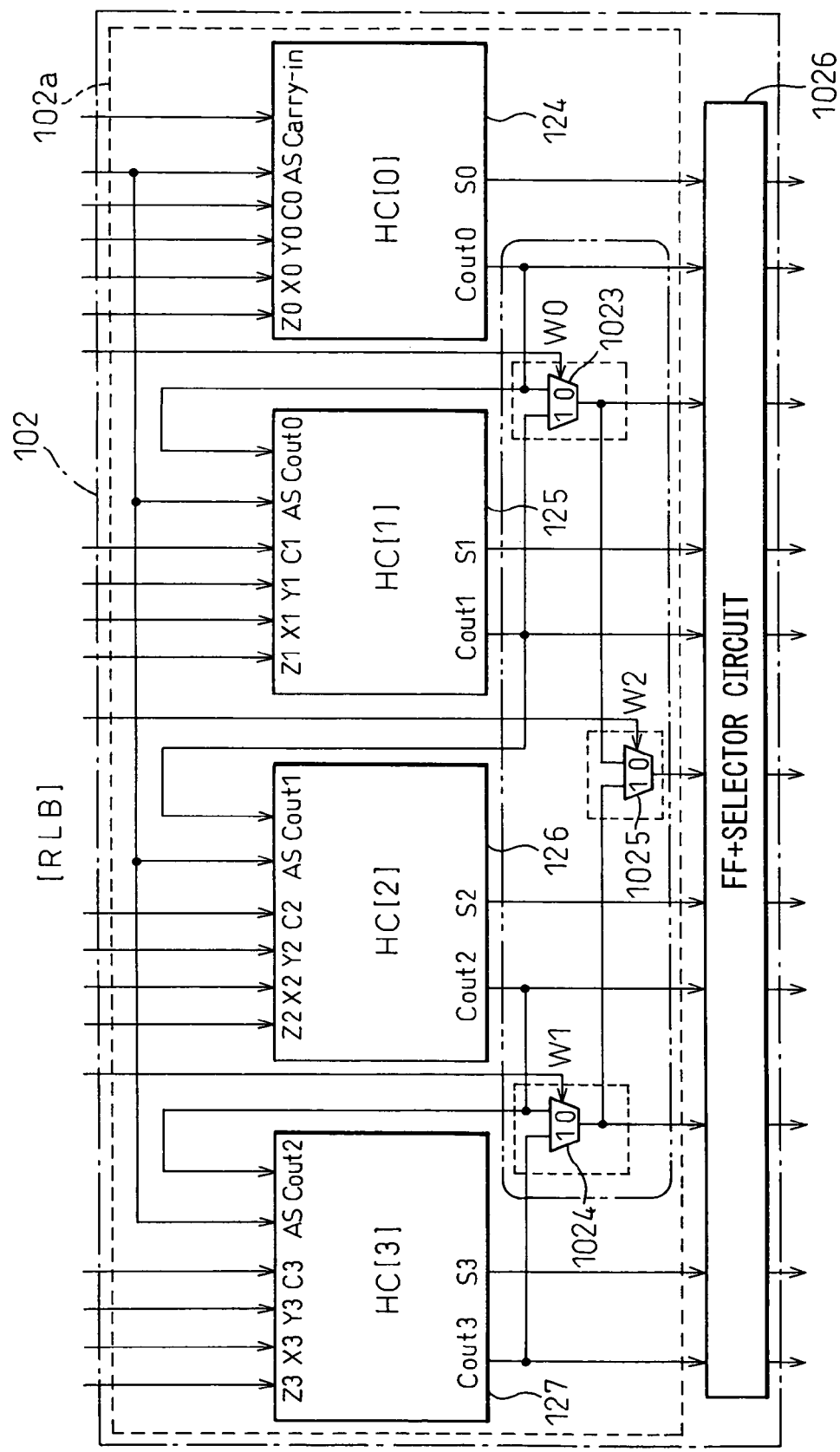
FIG. 19 is a block diagram of the configuration of the RLB shown in FIG. 18.

A block diagram of the configuration of the RLB of FIG. 18 is shown in FIG. 19. In FIG. 19, reference number 102*a* denotes a combination logic portion, 102*b* denotes a flip-flop and selector circuit (FF+selector circuit), 124 to 127 denote hybrid cells (HC[0] to HC[3]), and 1023 to 1025 denote multiplexer (MUX) circuits. In this case, the hybrid cells 124 to 127 have the same circuit configuration.

As shown in FIG. 19, the RLB 102 is provided with the combination logic portion 102*a* and the FF+selector circuit 102*b*, and the combination logic portion 102*a* is provided with the four hybrid cells 124 to 127 and the three MUX circuits 1023 to 1025. The MUX circuit 1023 selects one of the carry output Cout0 of the hybrid cell 124 and the carry output Cout1 of the hybrid cell 125, as specified by the signal W0; the MUX circuit 1024 selects one of the carry output Cout2 of the hybrid cell 126 and the carry output Cout3 of the hybrid cell 127, as specified by the signal W1; and the MUX circuit 1025 selects one of the output of the MUX circuit 1023 and the output of the MUX circuit 1024, as specified by the signal W2.

Figure 20:
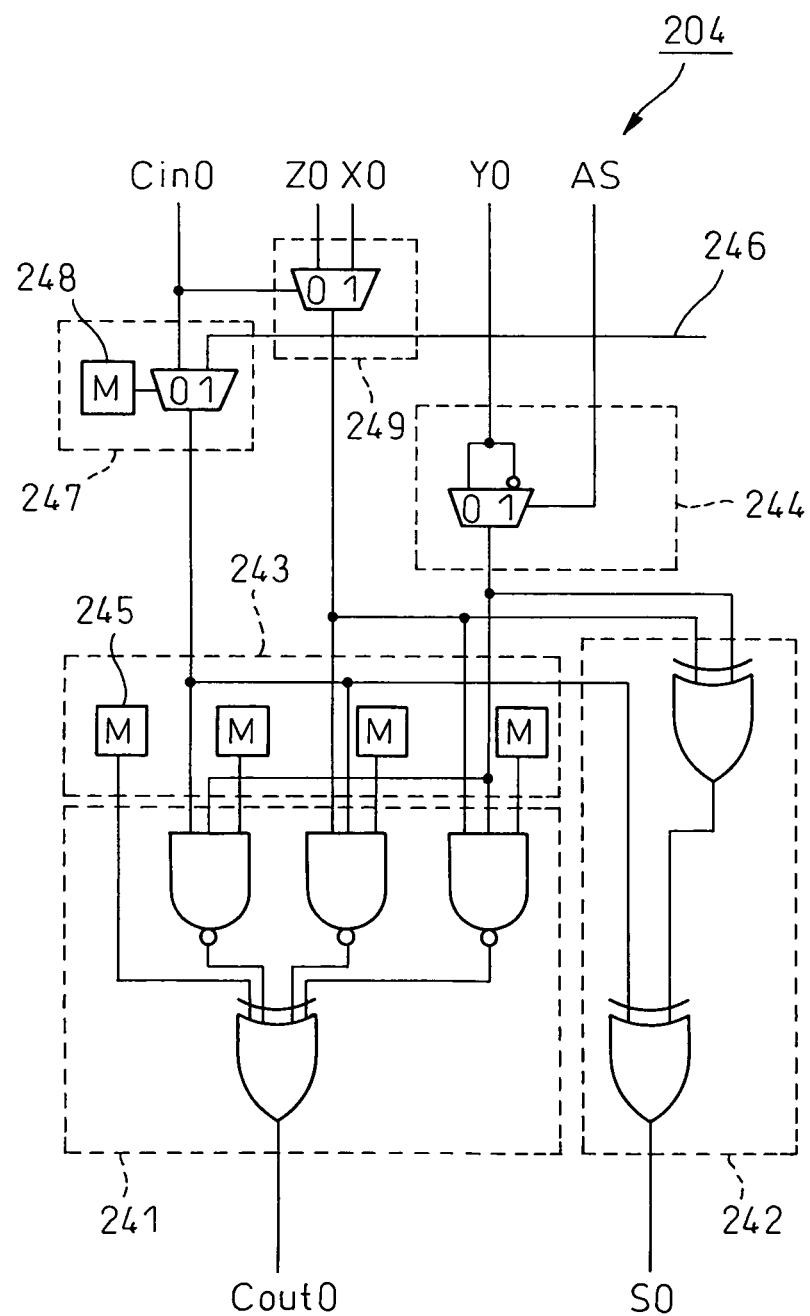
FIG. 20 is a logical circuit diagram of another example of the configuration of a hybrid cell in an RLB in accordance with the present invention.

A logical circuit diagram of another example of the configuration of a hybrid cell in an RLB in accordance with the present invention is shown in FIG. 20.

In FIG. 20, reference number 204 denotes a hybrid cell; 241 denotes an arithmetic circuit; 242 denotes an adder arithmetic circuit; 243, 245, and 248 denote configuration memory bits (M); 244 denotes an adder/subtractor selector circuit; 246 denotes a carry path; 247 denotes a carry path selector circuit; and 249 denotes an input selector circuit. Note that the hybrid cells 124 to 127 are each configured of the same hybrid cell 204, as described previously.

Figure 21:
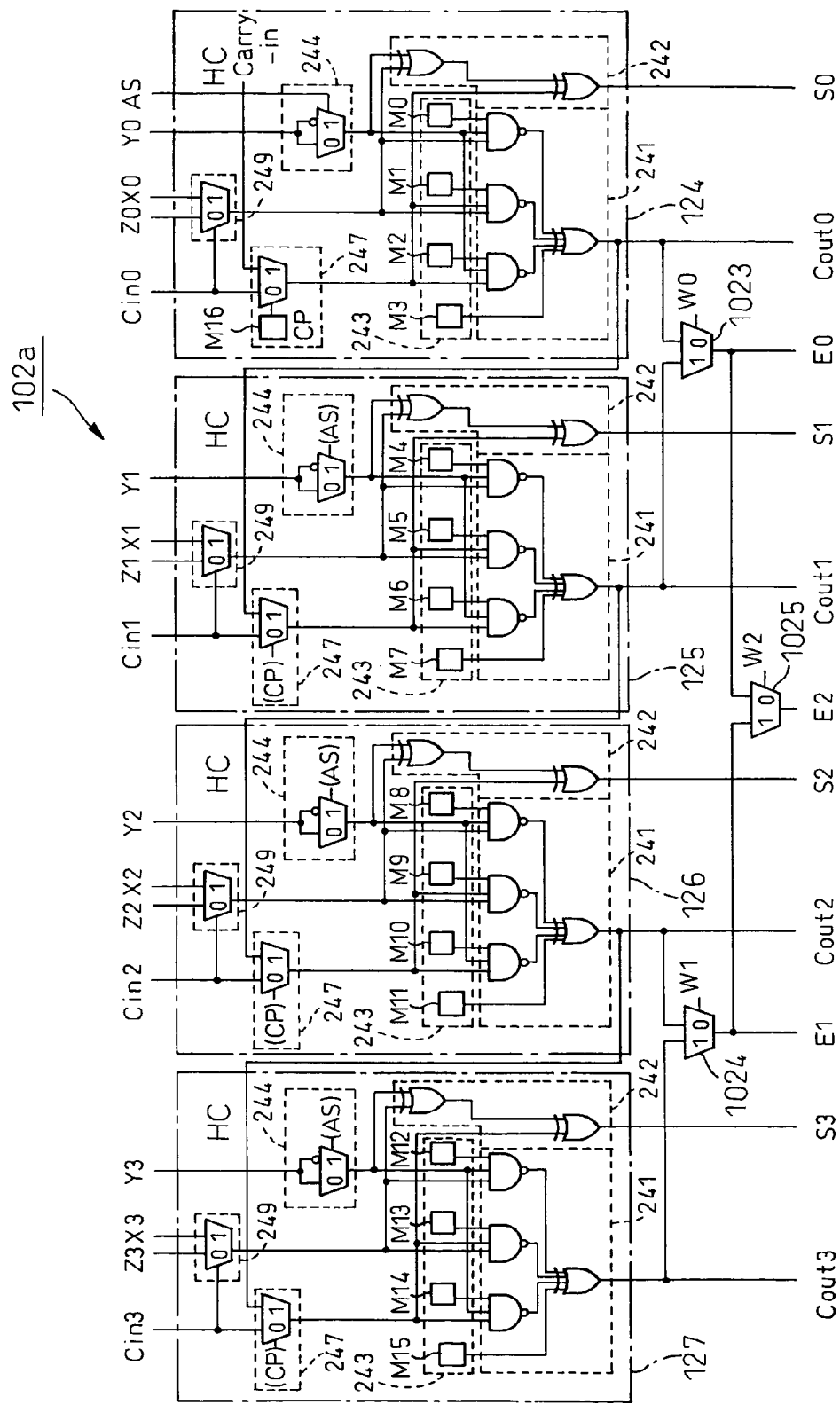
FIG. 21 is a logical circuit diagram of another embodying example of an RLB in accordance with the present invention.

A logical circuit diagram of the configuration of another embodying example of an RLB in accordance with the present invention is shown in FIG. 21, where four of the hybrid cells 204 (HC) shown in FIG. 20 (124 to 127) are assembled to create the combination logic portion 102*a* of the RLB 102 shown in FIG. 19.

As shown in FIGS. 21 and 19, the configuration is such that the MUX circuit 1023 selects one of the carry output Cout0 of the hybrid cell 124 and the carry output Cout1 of the hybrid cell 125 as specified by the signal W0, and outputs it as the signal E0; the MUX circuit 1024 selects one of the carry output Cout2 of the hybrid cell 126 and the carry output Cout3 of the hybrid cell 127 as specified by the signal W1, and outputs it as the signal E1; and the MUX circuit 1025 selects one of the output signal E0 of the MUX circuit 1023 and the output signal E1 of the MUX circuit 1024 as specified by the signal W2, and outputs it as the signal E2.

This configures the combination logic portion 102*a* of an RLB (in other words, the RLB 102) that has a total of 21 inputs which are three W inputs W0 to W2, four X inputs X0 to X3, four Y inputs Y0 to Y3, four Z inputs Z0 to Z3, four Cin inputs Cin0 to Cin3, one AS input AS, and one Carry-in input Carry-in; a total of 11 outputs which are three E outputs E0 to E2, four S outputs S0 to S3, and four Cout outputs Cout0 to Cout3; and 17 memory bits M0 to M16.

FIGS. 22A to 25B show examples of circuits configured of the RLB shown in FIG. 21.

Figure 22A:
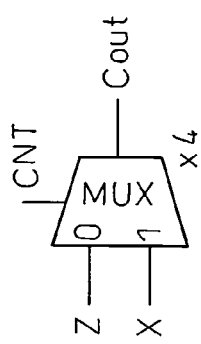
FIGS. 22A and 22B show an example of a circuit configured of the RLB shown in FIG. 21 (1 of 4)
Figure 22B:
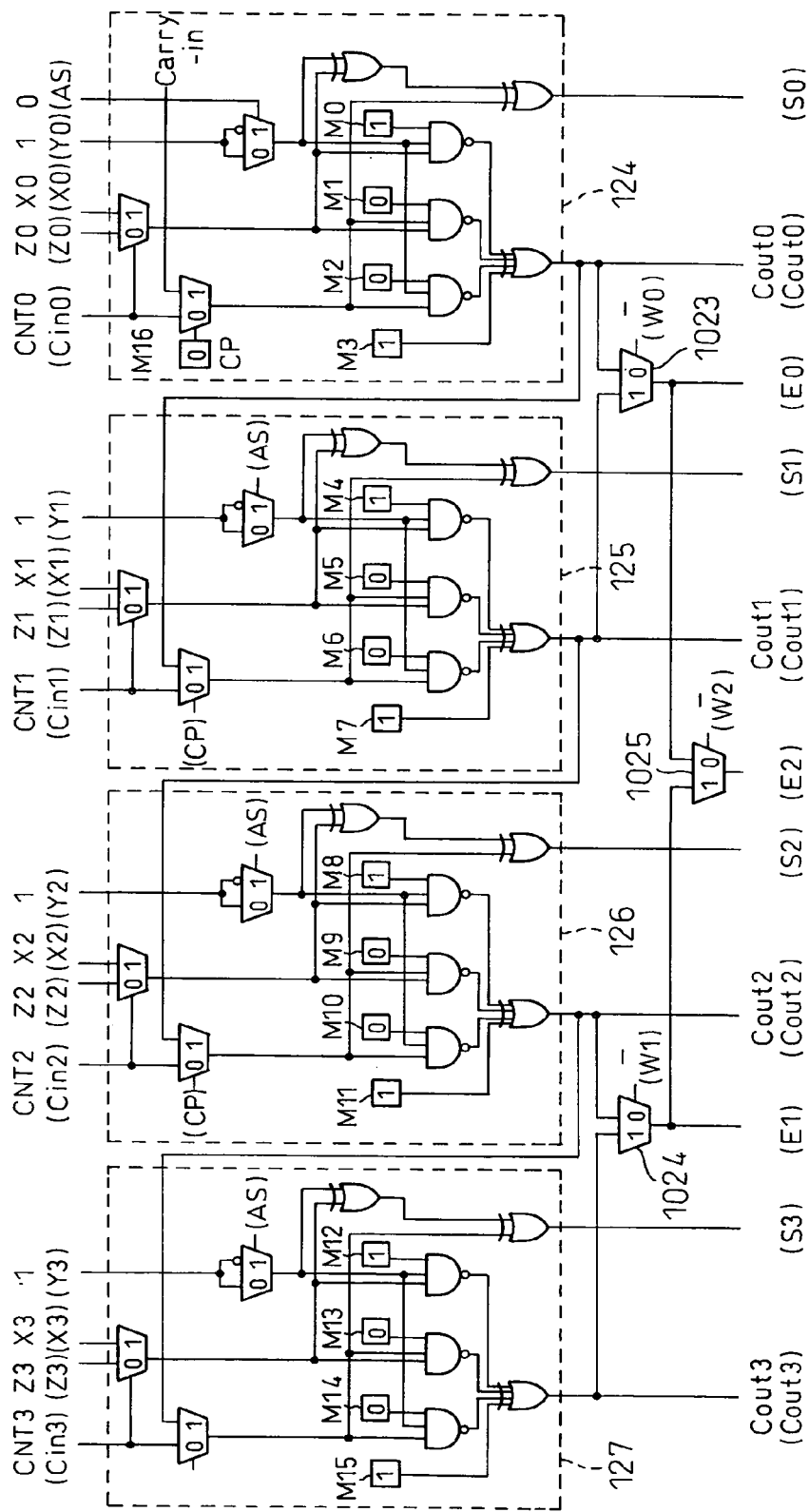

FIGS. 22A and 22B show the previously-described four MUXes of FIG. 8(b), where FIG. 22A shows a function block of an MUX and FIG. 22B shows the input-output signals and the logic pattern when the circuitry is configured from the combination logic portion 102a shown in FIG. 21.

In other words, to configure the four MUXes from the combination logic portion 102a shown in FIG. 21, data "1" is written to the memory bits M0, M3, M4, M7, M8, M11, M12, M15, and M16 and data "0" is written to M1, M2, M5, M6, M9, M10, M13, and M14. In addition, the four MUXes can be configured of the RLB shown in FIG. 21 by setting the various input-output signals thereof as shown in FIG. 22B.

Figure 23A:
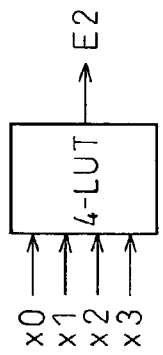
FIGS. 23A and 23B show another example of a circuit configured of the RLB shown in FIG. 21 (2 of 4)
Figure 23B:
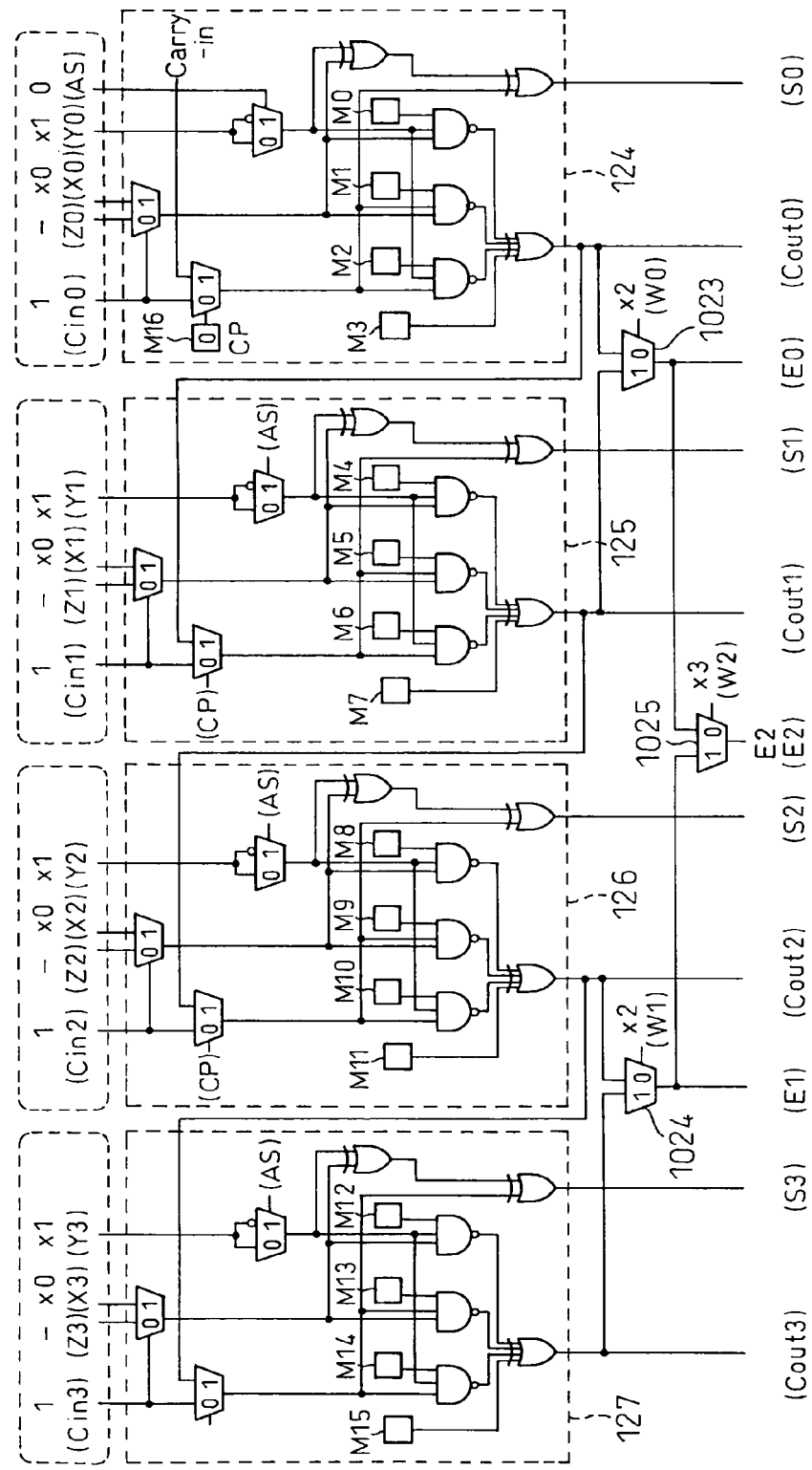

FIGS. 23A and 23B show the single 4-LUT of FIG. 8(c), where FIG. 23A shows the function block of the 4-LUT and FIG. 23B shows the input-output signals and the logic pattern when the circuitry is configured from the combination logic portion 102a shown in FIG. 7.

In other words, to configure one 4-LUT from the combination logic portion 102a shown in FIG. 21, data that achieves the input-output relationships that are necessary for this LUT is written to the memory bits M0 to M15, and data "0" is written to the memory bit M16. In addition, the one 4-LUT can be configured of the RLB shown in FIG. 21 by setting the input-output signals as shown in FIG. 23B.

Figures 24A, 24B:
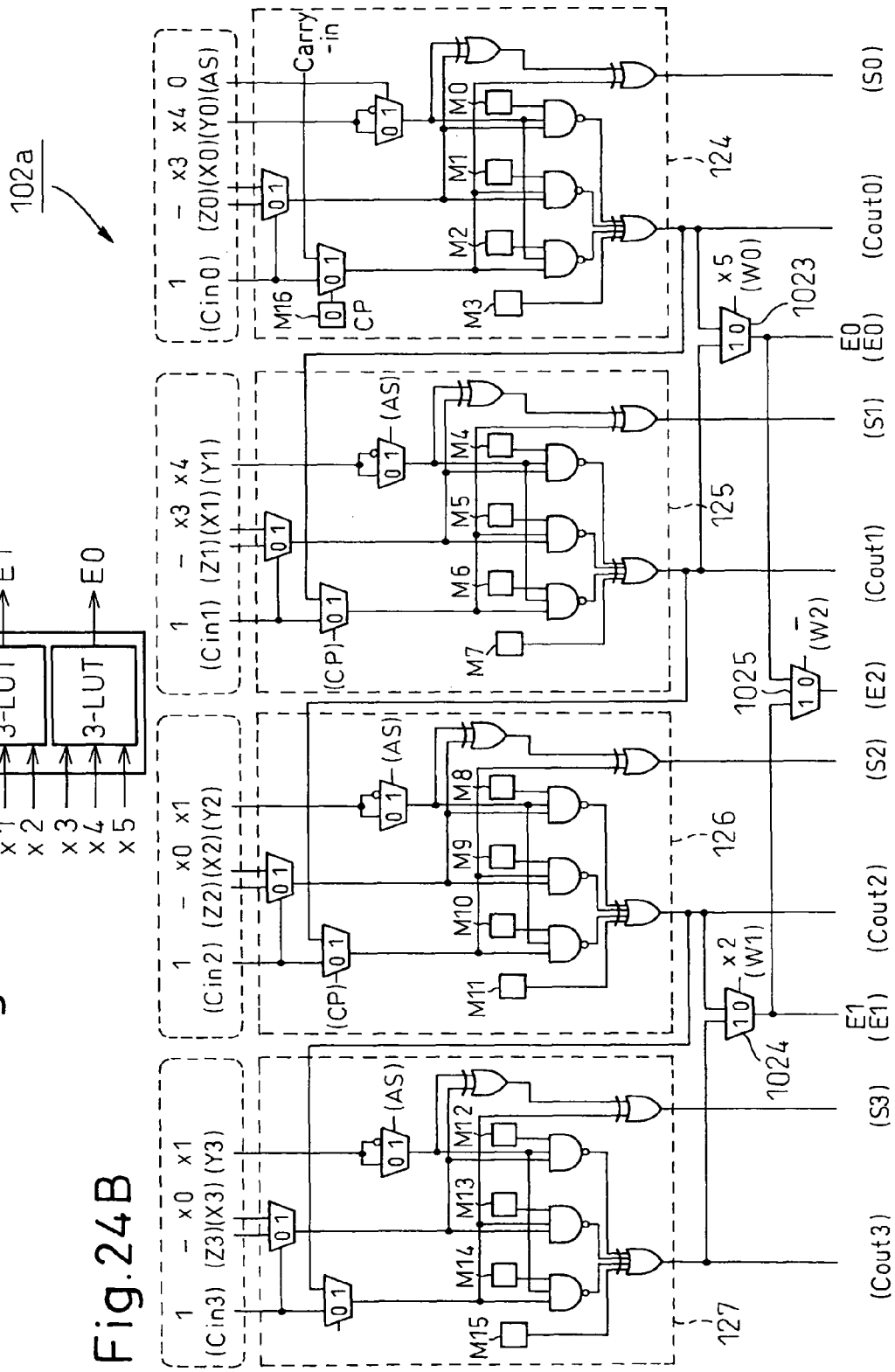
FIGS. 24A and 24B show another example of a circuit configured of the RLB shown in FIG. 21 (3 of 4)
Figures 25A, 25B:
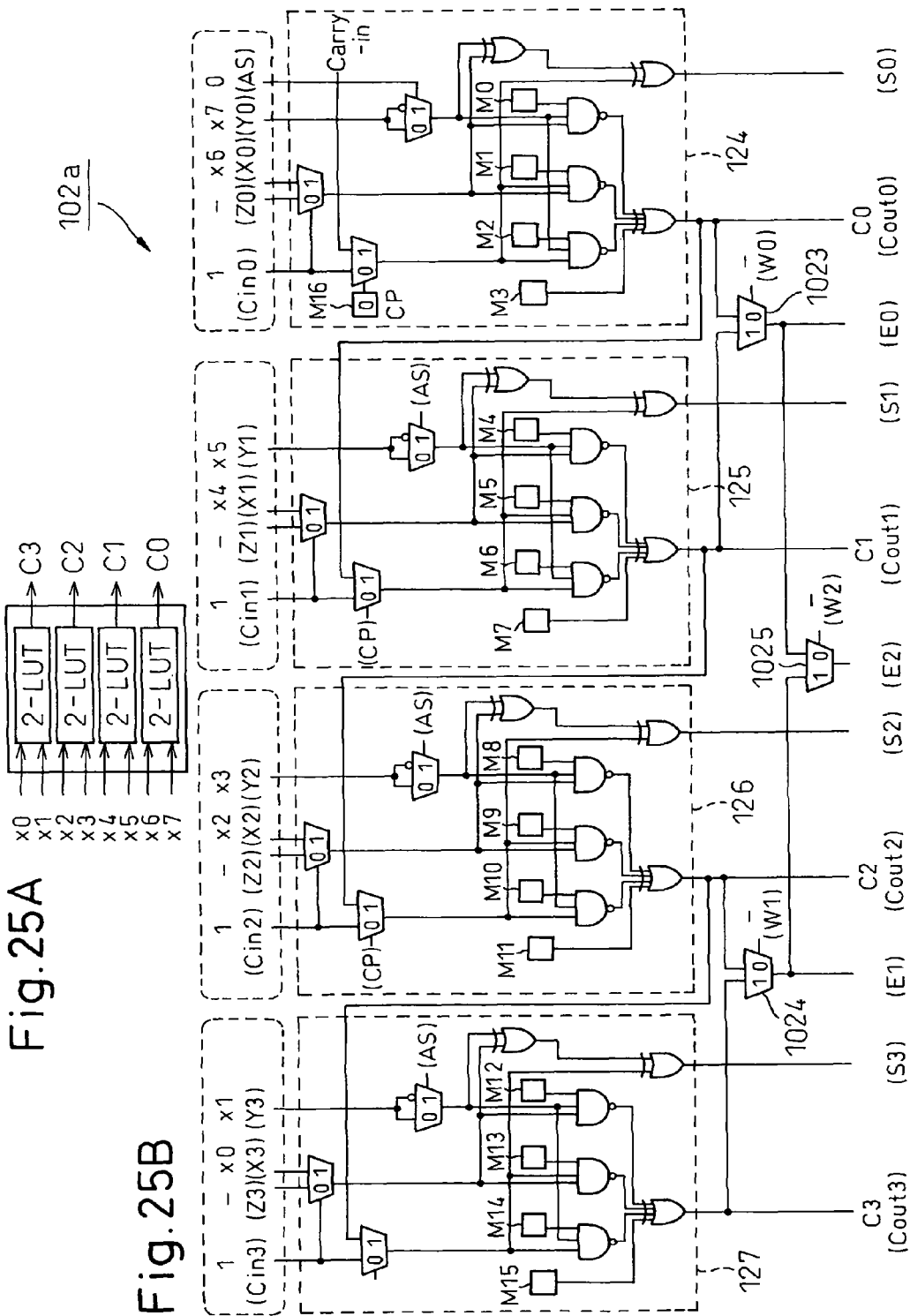
FIGS. 25A and 25B show another example of a circuit configured of the RLB shown in FIG. 21 (4 of 4).

FIGS. 24A and 24B together with FIGS. 25A and 25B are similar, where FIGS. 24A and 24B show the two 3-LUTs of FIG. 8(d) and FIGS. 25A and 25B show the four 2-LUTs of FIG. 8(e). Each of FIGS. 24A and 25A shows a function block, and FIGS. 24B and 25B show the input-output signals and the logic pattern when the corresponding circuit is configured of the combination logic portion 102a shown in FIG. 21.

Note that the combination logic portion 102a shown in FIG. 21 could be configured of various different circuits other than those shown in the above-described FIGS. 22A to 25B, and thus it is possible to create various different circuits such as one comprising one 8-input, 1-output MUX and two 4-input, 1-output MUXes or one comprising one 4-input, 1-output MUX and two 2-input, 1-output MUXes, by way of example.

Thus, since the RLBs described with reference to FIGS. 18 to 25B can use just one type of hybrid cell (HC), the circuit configurations thereof are simplified and it is also possible to regulate the input patterns and add a wider range of MUX functions.

The present invention enables the provision of a programmable logic device that can maintain the high area efficiency of the chip, regardless of the circuitry configured therein, and aim for both a higher speed and a lower low power consumption.

The present invention can be applied to a reconfigurable logic block, or a programmable logic device provided with such a reconfigurable logic block, that can create various different circuits as necessary by the setting of input-output signals and the logic pattern thereof. Furthermore, the present invention can also be applied to ASICs (or structured ASICs) by configuring circuitry which fixes the input-output signals and logic pattern for each reconfigurable logic block.

Many different embodiments of the present invention may be constructed without departing from the scope of the present invention, and it should be understood that the present invention is not limited to the specific embodiments described in this specification, except as defined in the appended claims.

What is claimed is:

1. A reconfigurable logic block comprising a first circuit that configures an arithmetic circuit and a second circuit that configures a circuit outside
   of said arithmetic circuit, wherein:
   said reconfigurable logic block comprises a plurality of hybrid cells including at least first and second hybrid cells, and each of said hybrid cells includes a memory and a plurality of logic gates and is capable of configuring one of a fine-grain cell and a coarse-grain cell;
   said first circuit includes said first hybrid cell, and is implemented as an adder circuit by changing a setting of an input node level of at least one of said logic gates of said first hybrid cell configured to said coarse-grain cell based on data stored in said memory of said first hybrid cell or a fixed voltage level; and
   said second circuit includes said second hybrid cell, and is implemented as a canonical form of logic circuit by changing a setting of an input node level of at least one of said logic gates of said second hybrid cell configured to said fine-grain cell based on data stored in said memory of said second hybrid cell or a fixed voltage level.

2. The reconfigurable logic block as claimed in claim 1, wherein said first circuit is a full-adder circuit or a half-adder circuit.

3. The reconfigurable logic block as claimed in claim 1, wherein said second circuit is a Reed-Muller canonical form of logic circuit.

4. The reconfigurable logic block as claimed in claim 1, wherein said first circuit comprises a plurality of adder circuits, and wirings among said plurality of adder circuits are formed within said reconfigurable logic block.

5. The reconfigurable logic block as claimed in claim 1, wherein:
   the setting of predetermined signals in said first and second circuits is done based on the data stored in said memory or the fixed voltage level.

6. The reconfigurable logic block as claimed in claim 5, further comprising:
   signal lines for setting predetermined signals in said first and second circuits at a first power level or a second power level of said fixed voltage level.

7. The reconfigurable logic block as claimed in claim 1, wherein:
   said memory is a volatile memory, and data is written to said volatile memory during an initial setting in which a power voltage is supplied to said reconfigurable logic block.

8. The reconfigurable logic block as claimed in claim 1, wherein:
   said memory is a non-volatile memory, and write processing of data is performed beforehand with respect to said non-volatile memory before said reconfigurable logic block is activated for use in practice.

9. The reconfigurable logic block as claimed in claim 1, wherein said plurality of hybrid cells have differing circuit configurations.

10. The reconfigurable logic block as claimed in claim 1, wherein said a plurality of hybrid cells have the same circuit configuration.

11. A programmable logic device comprising a plurality of reconfigurable logic blocks arrayed in a matrix, a plurality of wires connecting said reconfigurable logic blocks, a plurality of switch blocks provided at intersections between said wires, a plurality of connection blocks provided between input-output lines of each of said reconfigurable logic blocks and said wires, and I/O blocks that perform input and output with respect to the exterior, wherein:
  each of said reconfigurable logic blocks comprises a first circuit that configures an arithmetic circuit and a second circuit that configures a circuit outside of said arithmetic circuit;
  said reconfigurable logic block comprises a plurality of hybrid cells including at least first and second hybrid cells, and each of said hybrid cells includes a memory and a plurality of logic gates;
  said reconfigurable logic block comprises a plurality of hybrid cells including at least first and second hybrid cells, and each of said hybrid cells includes a memory and a plurality of logic gates and is capable of configuring one of a fine-grain cell and a coarse-grain cell;
  said first circuit includes said first hybrid cell, and is implemented as an adder circuit by changing a setting of an input node level of at least one of said logic gates of said first hybrid cell configured to said coarse-grain cell based on data stored in said memory of said first hybrid cell or a fixed voltage level; and
  said second circuit includes said second hybrid cell, and is implemented as a canonical form of logic circuit by changing a setting of an input node level of at least one of said logic gates of said second hybrid cell configured to said fine-grain cell based on data stored in said memory of said second hybrid cell or a fixed voltage level.

12. The programmable logic device as claimed in claim 11, wherein said first circuit is a full-adder circuit or a half-adder circuit.

13. The programmable logic device as claimed in claim 11, wherein said second circuit is a Reed-Muller canonical form of logic circuit.

14. The programmable logic device as claimed in claim 11, wherein said first circuit comprises a plurality of adder circuits, and wirings among said plurality of adder circuits are formed within said reconfigurable logic block.

15. The programmable logic device as claimed in claim 11, wherein:
  the setting of predetermined signals in said first and second circuits is done based on the data stored in said memory or the fixed voltage level.

16. The programmable logic device as claimed in claim 15, wherein said reconfigurable logic block further comprises:
  signal lines for setting predetermined signals in said first and second circuits at a first power level or a second power level of said fixed voltage level.

17. The programmable logic device as claimed in claim 11, wherein:
  said memory is a volatile memory, and data is written to said volatile memory during an initial setting in which a power voltage is supplied to said reconfigurable logic block.

18. The programmable logic device as claimed in claim 11, wherein:
  said memory is a non-volatile memory, and write processing of data is performed beforehand with respect to said non-volatile memory before said reconfigurable logic block is activated for use in practice.

19. The programmable logic device as claimed in claim 11, wherein said plurality of hybrid cells have differing circuit configurations.

20. The programmable logic device as claimed in claim 11, wherein said plurality of hybrid cells have the same circuit configuration.

21. A method of creating a reconfigurable logic block comprising a first circuit that configures an arithmetic circuit and a second circuit that configures a circuit outside of said arithmetic circuit, wherein:
  said reconfigurable logic block comprises a plurality of hybrid cells including at least first and second hybrid cells, and each of said hybrid cells includes a memory and a plurality of logic gates and is capable of configuring one of a fine-grain cell and a coarse-grain cell;
  said first circuit includes said first hybrid cell, and is implemented as an adder circuit by changing a setting of an input node level of at least one of said logic gates of said first hybrid cell configured to said coarse-grain cell based on data stored in said memory of said first hybrid cell or a fixed voltage level; and
  said second circuit includes said second hybrid cell, and is implemented as a canonical form of logic circuit by changing a setting of an input node level of at least one of said logic gates of said second hybrid cell configured to said fine-grain cell based on data stored in said memory of said second hybrid cell or a fixed voltage level.

22. The method of fabricating a reconfigurable logic block as claimed in claim 21, wherein said first circuit comprises a full-adder circuit or a half-adder circuit.

23. The method of fabricating a reconfigurable logic block as claimed in claim 21, wherein said second circuit comprises a Reed-Muller canonical form of logic circuit.

24. The method of fabricating a reconfigurable logic block as claimed in claim 21, wherein said first circuit comprises a plurality of adder circuits, and wirings among said plurality of adder circuits are formed within said reconfigurable logic block.

25. The method of fabricating a reconfigurable logic block as claimed in claim 21, wherein:
  the setting of predetermined signals in said first and second circuits is done based on the data stored in said memory or the fixed voltage level.

26. The method of fabricating a reconfigurable logic block as claimed in claim 25, wherein:
  the setting of predetermined signals in said first and second circuits is done based on the fixed voltage level of a signal line.

27. The method of fabricating a reconfigurable logic block as claimed in claim 21, wherein:
  said memory is a volatile memory, and data is written to said volatile memory in an initial setting in which power is supplied to said reconfigurable logic block.

28. The method of fabricating a reconfigurable logic block as claimed in claim 21, wherein:
  said memory is a non-volatile memory, and write processing of data is performed beforehand with respect to said non-volatile memory before said reconfigurable logic block is activated for use in practice.

29. A method of configuring an ASIC by utilizing a method of creating a reconfigurable logic block comprising a first circuit that configures an arithmetic circuit and a second circuit that configures a circuit outside of said arithmetic circuit, wherein:
  said reconfigurable logic block comprises a plurality of hybrid cells including at least first and second hybrid cells, and each of said hybrid cells includes a memory and a plurality of logic gates and is capable of configuring one of a fine-grain cell and a coarse-grain cell;

said first circuit includes said first hybrid cell, and is implemented as an adder circuit by changing a setting of an input node level of at least one of said logic gates of said first hybrid cell configured to said coarse-grain cell based on data stored in said memory of said first hybrid cell or a fixed voltage level; and said second circuit includes said second hybrid cell, and is implemented as a canonical form of logic circuit by changing a setting of an input node level of at least one of said logic gates of said second hybrid cell configured to said fine-grain cell based on data stored in said memory of said second hybrid cell or a fixed voltage level.

30. The method of configuring an ASIC as claimed in claim 29, wherein said first circuit comprises a full-adder circuit or a half-adder circuit.

31. The method of configuring an ASIC as claimed in claim 29, wherein said second circuit comprises a Reed-Muller canonical form of logic circuit.

32. The method of configuring an ASIC as claimed in claim 29, wherein said first circuit comprises a plurality of adder circuits, and wirings among said plurality of adder circuits are formed within said reconfigurable logic block.

33. A reconfigurable logic block comprising a first circuit that configures an arithmetic circuit and a second circuit that configures a circuit outside of said arithmetic circuit, wherein:

said reconfigurable logic block comprises a plurality of hybrid cells including a first hybrid cell and a second hybrid cell, each of said first and second hybrid cells being capable of configuring one of a fine-grain cell and a coarse-grain cell;

said first circuit comprises said first hybrid cell including a first memory and a plurality of logic gates, and said first circuit is implemented as an adder circuit by changing a setting of an input node level of each of the logic gates of said first hybrid cell configured to said coarse-grain cell based on data stored in said first memory of said first hybrid cell or a fixed voltage level; and said second circuit includes said second hybrid cell, and is implemented as a canonical form of logic circuit by changing a setting of an input node level of at least one of logic gates of said second hybrid cell configured to said fine-grain cell based on data stored in a memory of said second hybrid cell or a fixed voltage level.

* * * * *